United States Patent [19]

Sacks

[11] 4,076,969

[45] Feb. 28, 1978

[54] IMPULSE NOISE REDUCTION SYSTEM

[75] Inventor: Jack Sacks, Thousand Oaks, Calif.

[73] Assignee: Singer & Singer, Torrance, Calif.; a part interest

[21] Appl. No.: 565,876

[22] Filed: Apr. 7, 1975

[51] Int. Cl.² .............................................. G11B 3/00
[52] U.S. Cl. ........................... 179/100.4 D; 179/1 P; 179/100.1 R; 179/100.4 ST; 360/38
[58] Field of Search ............... 179/100.4 D, 100.4 ST, 179/100.4 A, 100.1 R, 100.1 TD, 100.3 B, 100.3 T, 1 P; 360/27, 38; 333/17 R

[56] References Cited

U.S. PATENT DOCUMENTS

| 3,110,769 | 11/1963 | Bertram | 179/100.1 TD |
| 3,678,416 | 7/1972 | Burwen | 333/17 R |
| 3,947,636 | 3/1976 | Edgar | 333/17 R |

FOREIGN PATENT DOCUMENTS

| 1,149,919 | 6/1963 | Germany | 179/100.4 D |
| 741,333 | 11/1955 | United Kingdom | 179/100.4 D |
| 941,704 | 11/1963 | United Kingdom | 179/100.4 D |

Primary Examiner—Raymond F. Cardillo, Jr.
Attorney, Agent, or Firm—Singer & Singer

[57] ABSTRACT

This invention describes a system and method for detecting unwanted pop and click sound signals caused by mechanical defects on a recording medium. A pair of wholly or partially correlated signals is generated from the recorded sound information by a conventional stereo pickup device. The output signals of the stereo pickup device are combined so that desired sound signals generated by horizontal movement on the record medium are subtracted and undesired signals generated by vertical movement on the record medium are added. The resulting undesired signal representing clicks and pops is detected as the noise signal. A gating signal starting before the leading edge of the detected undesired sound signal terminating innocuously on the sound signal, and having a width that is greater than the width of the detected undesired sound signal, is used in the system to eliminate the undesired signals.

15 Claims, 25 Drawing Figures

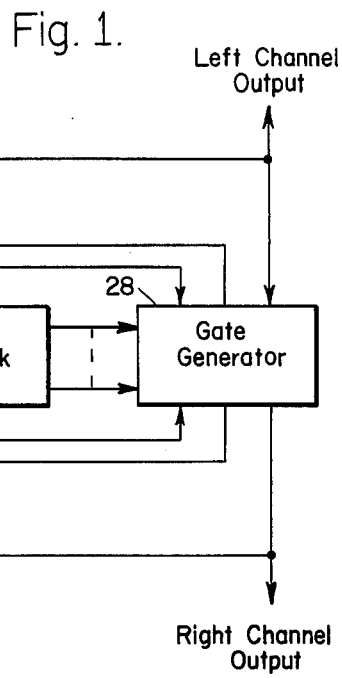
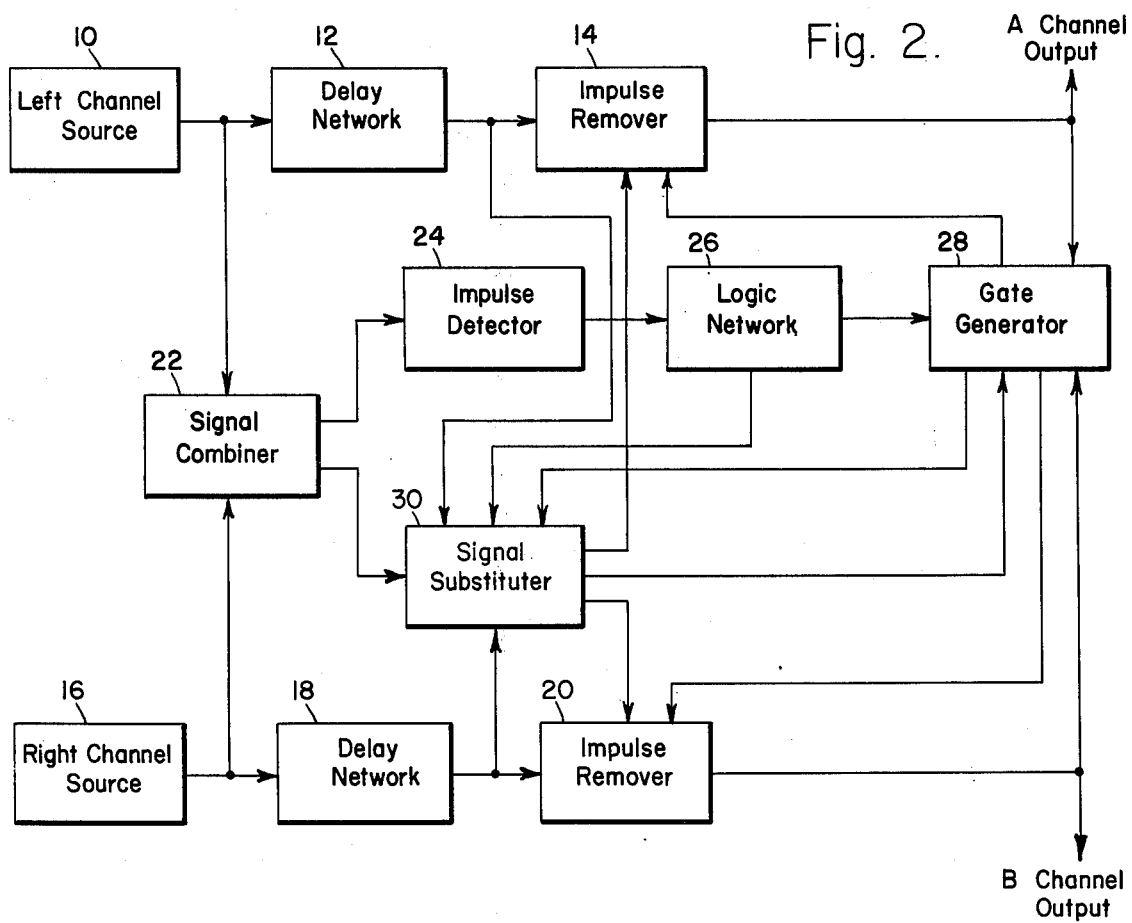

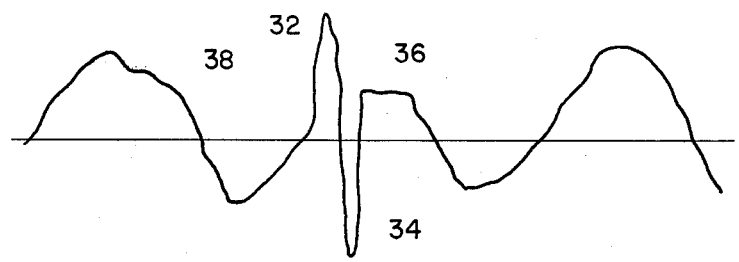
Fig. 3.
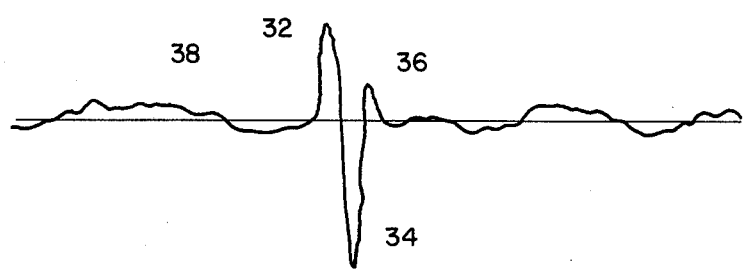
Fig. 4.
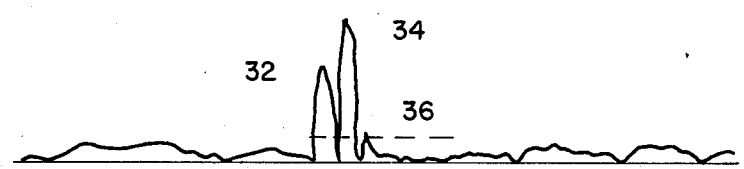
Fig. 5.
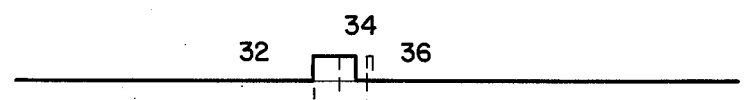
Fig. 6.
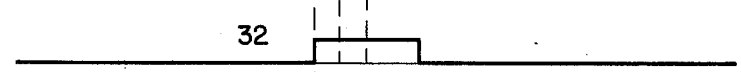
Fig. 7.
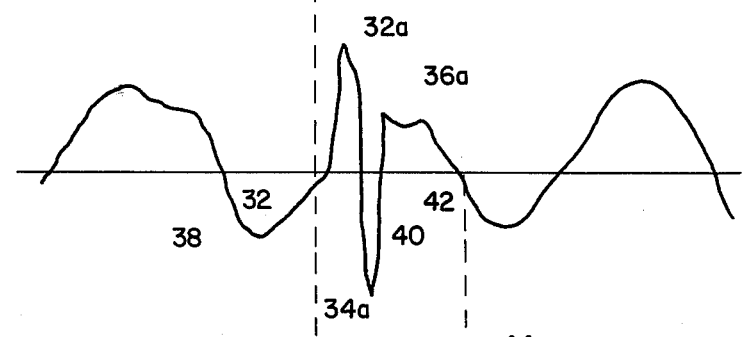
Fig. 8.
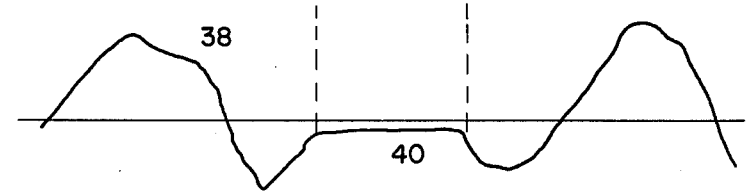
Fig. 9.
Fig. 10.

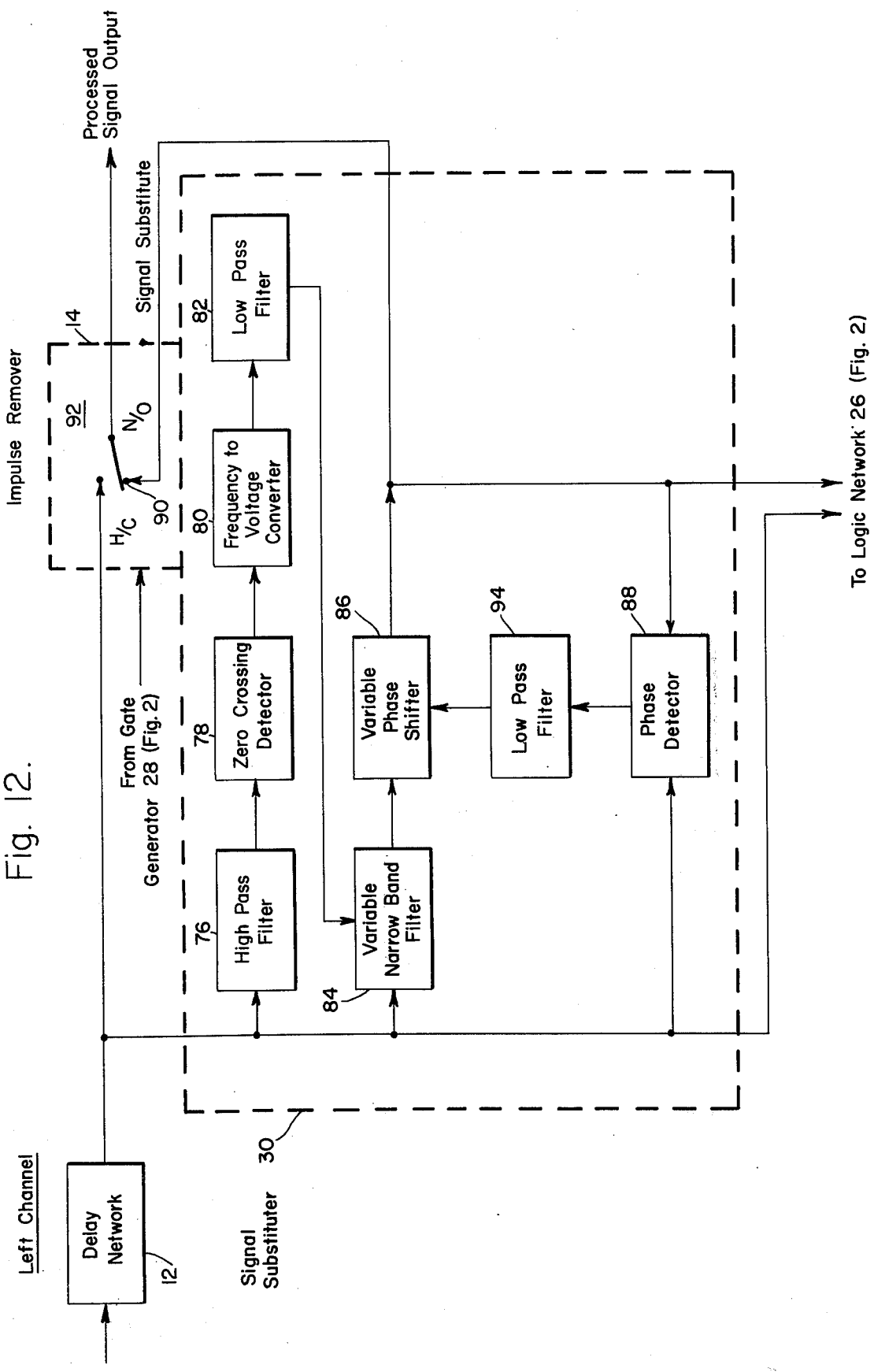

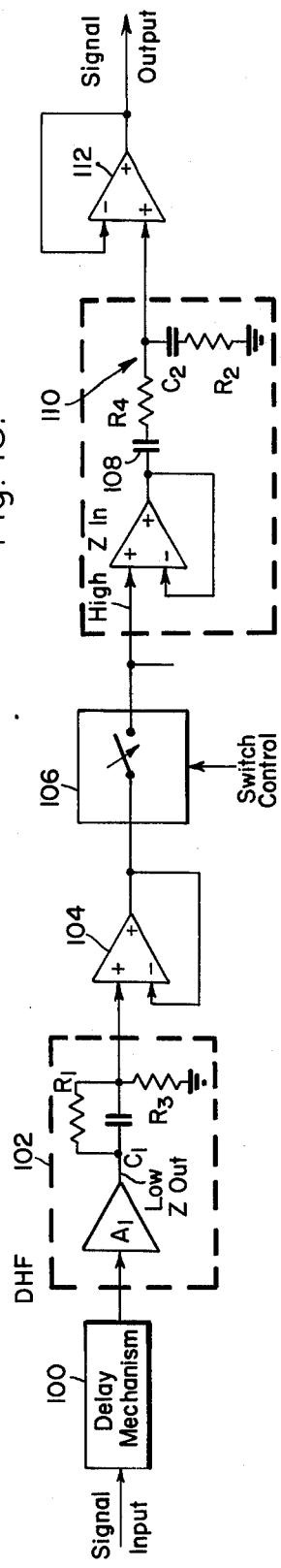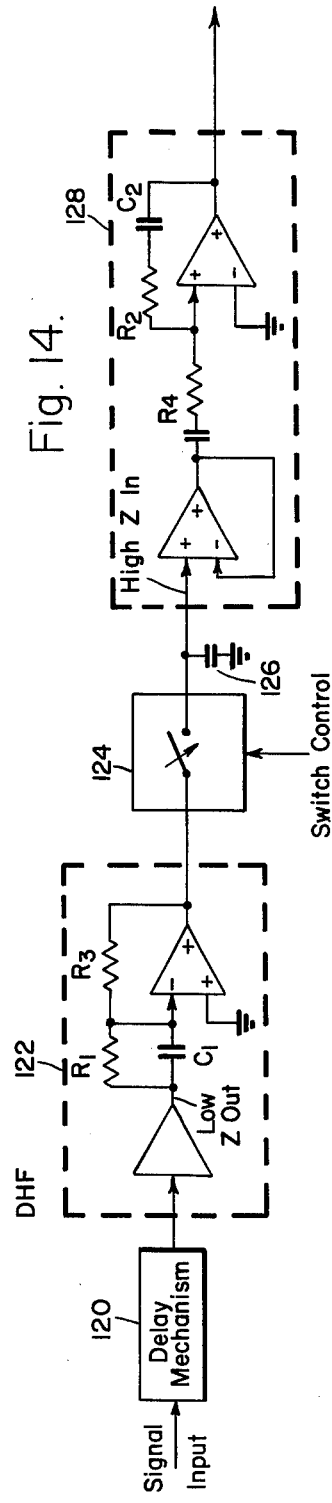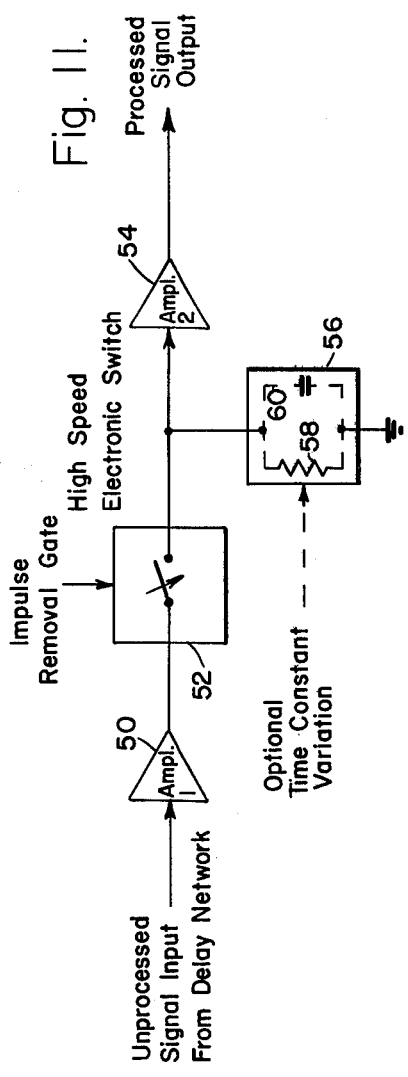

IMPULSE NOISE REDUCTION SYSTEM

This invention relates to a method and system for use with a record medium that is capable of substantially removing mechanically generated signals generally called pops and clicks.

The recording art today is highly sophisticated and is capable of generating sound of high purity and faithful tone qualities. It is generally recognized that the recording disc when properly constructed and pressed by quality equipment is capable of faithfully reproducing the full spectrum of sound reproduction that is generally accepted to be superior to any other recording medium.

Unfortunately, record discs remain new for a very short period of time. General degradation of the disc results primarily from the very act of using a mechanical stylus to reproduce the sound on the record disc and also by the necessity of physically handling the record as a result of using, storing and playing the record.

The stacking of records one against the other and the handling of the records, which includes automatic record handling equipment, takes a large toll from the useful life of the record. Experience has shown that the hills and the valleys defining the grooves on the record medium are subjected to mechanical damage which results in unwanted sound signals being generated by the stylus.

In addition, it has been discovered that dust and other fine particles falling within the grooves on the record, either during storage or while the record is being used, produces additional unwanted sound signals called tics since they are usually of short duration and of low amplitude. The prior art has recognized these undesirable noise signals and an article by Ralph Hodges in Popular Mechanics in the March 1974 issue in an article entitled "Stereo Scene" fully describes undesirable external noises which he defines as pops, tics, spits, spatters, and the like.

The term "desired sound signal" is intended to define the intentionally recorded information placed on the record medium which the user is intending to reproduce. The term "undesired sound signals" defines those sound signals emanating from the recording caused by mechanical defects on the record medium itself which produce sound signals not originally recorded on the medium and not intended by the user to be reproduced.

The problem of utilizing damaged records, both by the commercial user and the home user, has been recognized by the industry for many years. The inventory of older records that are now out of date in the homes and in the various studios throughout the country represents an investment in the tens of millions where the amount can be calculated and in other ways the value is incalculable when it is considered that the performers are no longer available.

Companies such as RCA have attempted to generate a new master tape from an existing damaged record by using specially designed computer programs. The material on the record is run through recognition algorithms and processing algorithms in order to determine where the damaged spots exist on the record. The purpose of utilizing the algorithms and the computer is to determine where the objectionable spots are on the tape and remove and otherwise eliminate these objectionable areas on the finished reprocessed master tape. It is quite obvious that these prior art efforts are not concerned with a real time system for eliminating objectionable noise but, rather, with fairly complicated and complex systems for recreating a new master from a damaged disc.

The main problem associated with detecting undesired signals in the presence of desired signals on a record medium is the fact that undesired noise signals have waveforms and spectral characteristics that are extremely similar to certain desired signals on the record medium. Statistical analysis has shown that the undesired signals typically have a fast attack time and a fast decay time whereas music and other desired signals may also have a fast attack time but invariably have a slow decay time.

Studies have shown that the undesirable signals such as pops and clicks vary in length, amplitude and rise time over a wide range. The length varies from microseconds to several milliseconds.

Certain prior art systems have used delay lines of the order of 5 to 6 milliseconds in an attempt to first detect the sharp leading wavefront which may either be noise or desired signal. These systems then wait 5 or 6 milliseconds and then examine the trailing edge of the wavefront to thereby determine if the signal was noise or desired signal. If noise, the delayed signal would be suppressed, but if desired signal the delayed signal would not be suppressed.

Unfortunately these prior art systems had inherent difficulties in view of the need for such a long delay time. Delay lines of the order of 5 or 6 milliseconds unfortunately are large, expensive, and not readily available. In addition, such prior art systems have high false alarm rates on some types of recorded material. Furthermore, detection of two or more noise pulses within the five or six millisecond delay period could not easily be accomplished. A system having a high false alarm rate means that several closely spaced segments of sound having a length of 5 to 6 milliseconds would be removed when there was no undesirable signal present, thereby creating holes in the sound that are definitely audible and hence objectionable.

The detection of pops and clicks is further complicated by the fact that certain types of materials such as brass instruments are comprised mainly of spikes and modern synthetic music makers such as the Moog synthesizer and other devices that electronically generate music tend to generate sound having a plurality of spikes that are confusingly similar to undesired noise signals. In addition, the technique of creating rim shots on drums also generates signals confusingly similar to undesired noise signals.

These prior art systems would therefore detect rim shots, electronically generated music, trumpets, and sound signals having similar envelope shapes as undesired signals and remove them, thereby creating a high false alarm rate considered highly objectionable.

There is another more subtle problem associated with modern electronic or sampling delay lines (charge coupled devices, etc.) having a delay of the order of 5 milliseconds. By definition a 5 millisecond delay line means that every 5 milliseconds there is a sampling signal generating a fundamental frequency of the order of 200 HZ. A 200 HZ fundamental and all the harmonics associated with that fundamental is within the audible range and hence represents an additional problem that must be eliminated.

The prior art literature also describes another technique used by a British concern for detecting objectionable noise and reprocessing the original record into a new record medium. The British technique is to play the recording backwards at high speed and detect the slow rise time followed by the substantially fast rise time. In this fashion it is not necessary to wait the full 5 milliseconds before identifying the signal as noise.

The British system is obviously not used in real time but rather is used to identify the location on the record of the noise and then when playing the record in the proper direction to generate timing signals at the proper time to eliminate the undesired signals. This system is conceptually similar to the RCA system which is to create a new master tape free of unwanted noise signals and from the new master create additional disc pressings.

These prior art systems, while recognizing the problem, do not provide a solution for removing undesired signals from a record in real time.

The present invention is concerned primarily with a system and method for detecting undesired signals and removing the effect of these undesired signals from the sound system and in real time, without adversely affecting the quality of the desired recorded material.

In the present invention, detection is made upon either the leading edge or the first overshoot of the fast rising signal. A short delay line having a delay which may be as short as 50 microseconds but no greater than 1000 microseconds is used, depending upon application. Certain embodiments of the detecting system may use a delay of approximately 25 microseconds.

The inventive concept described herein is basically concerned with three areas of operation as follows:

1. Detecting the undesired signal in the presence of a desired signal,
2. Removing the offending undesired signal from the sound channel containing the desired signal, and
3. Inserting a signal within the gated-off portion that is compatible with the remaining desired sound signal.

Detection of the undesired signal is achieved by generating a pair of correlated signals from the record medium. In the preferred embodiment, a conventional stereo pickup head having a pair of sensors is used to generate an A channel and a B channel from the recording.

A single channel or mono recording will result in identical (totally correlated) channels A and B being generated at the output of the stereo pickup sensors. A stereo recorded signal will result in a left channel A and a right channel B being generated in which channels A and B will be partially correlated signals.

The benefits and advantages claimed for the present invention are achieved by generating a pair of correlated signals from the record medium. For a stereo record the output signals will be a left signal and a right signal, which signals are partially correlated. For a monaural record a conventional stereo pickup head will generate identical (correlated) left and right signals.

The pair of correlated signals are combined so as to attenuate desired recorded information on said record medium and enhance undesired sound signals. Recognizing for example that desired sound signals in a monaural record are in the horizontal components and that external noise is generally caused by vertical gouges, it is only necessary to invert the phase from each of the two pickups to attenuate the desired signal and enhance the noise signal.

Combining the output signals in such a way as to attenuate the desired signal allows the noise signal to be suitable detected and amplified.

A gating signal is initiated on the leading edge of the detected undesired signal. The width of the gating signal is selected to be greater than the width of the detected undesired sound signal.

The recorded signal on the record medium is amplified and delayed and the generated gating signal used on the delayed signal to gate out recorded sound information detected as undesired sound signals. The gated out sound signals located on the delayed sound signal channel are replaced with sound information that is innocuous and is audibly consistent with recorded information already on the record medium.

This invention is also concerned with different techniques for properly gating the desired sound channel whenever an undesired signal is detected.

It is well known that gating a signal on and off generates a transient noise condition which resembles the undesirable noise pulse signals. In other words, the very act of gating the desired channel into an Off condition has the effect of generating a noise spike which may be equal to or worse than the undesired signal being gated off. Similarly, gating the channel into an On condition also has the effect of generating a noise spike that may be equal to or worse than the undesired signal being removed.

Given the availability of a suitably long delay mechanism (of the order of several milliseconds), this problem could be alleviated by gating the signal ON and OFF precisely at appropriate zero crossings of the signal. Such a gating technique would require the precise location of the proper zero crossings after the offending noise pulse has been detected.

This invention is therefore concerned with replacing the gated-out portion of the desired sound channel with a non-offensive signal that is compatible with information already contained in the desired channel. This "filling in the gap" is necessary in order to prevent a hiatus from existing in the audible channel due to the removing of the undesired signal and to provide a smooth and inoffensive transition from the preceding desired signal into the gated-out region and back to desired signal at the termination of the gated-out region. Tests have shown that simply removing a portion of the undesired signal may generate noise signals that are as objectionable as the undesired signals being gated out. A plurality of techniques for replacing information into the gated-out portion are disclosed and claimed.

Further objects and advantages of the present invention will be made more apparent by referring now to the accompanying drawings wherein:

FIG. 1 is a conceptual block diagram of an impulse noise reduction system;

FIG. 2 is a block diagram of an impulse noise reduction system with signal substituter;

FIGS. 3, 4, 5, 6, 7, 8, 9 and 10 are waveforms illustrating the operation of the circuits illustrated in FIGS. 1 and 2;

FIG. 11 is a block diagram of a first embodiment of signal substitution by insertion of an exponentially decaying signal;

FIG. 12 is a block diagram illustrating an embodiment for reconstituting and inserting a signal;

FIG. 13 and FIG. 14 are block diagrams illustrating alternate noise pulse removal schemes with synthesized signal insertions;

Figure 15:
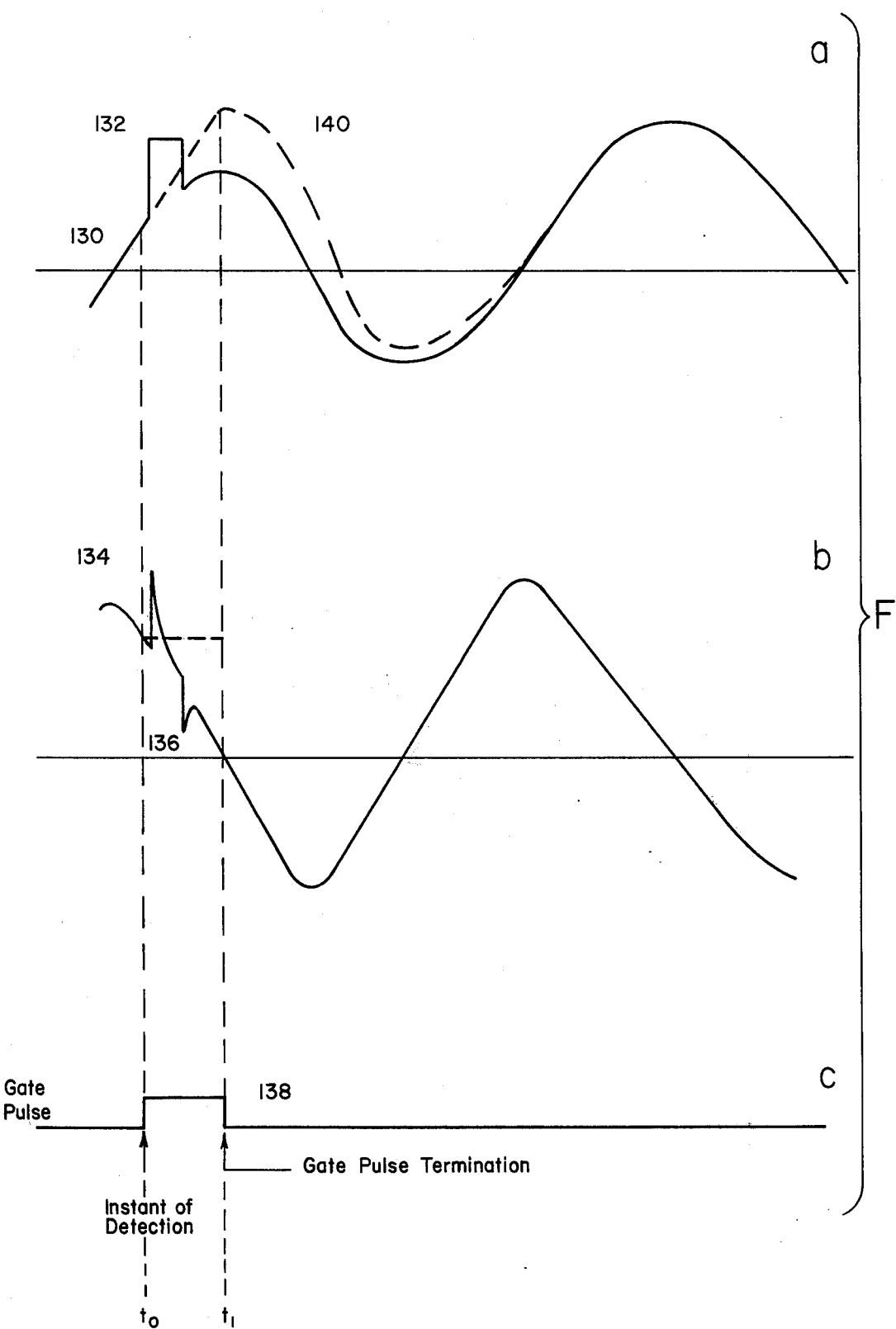
Figure 16:
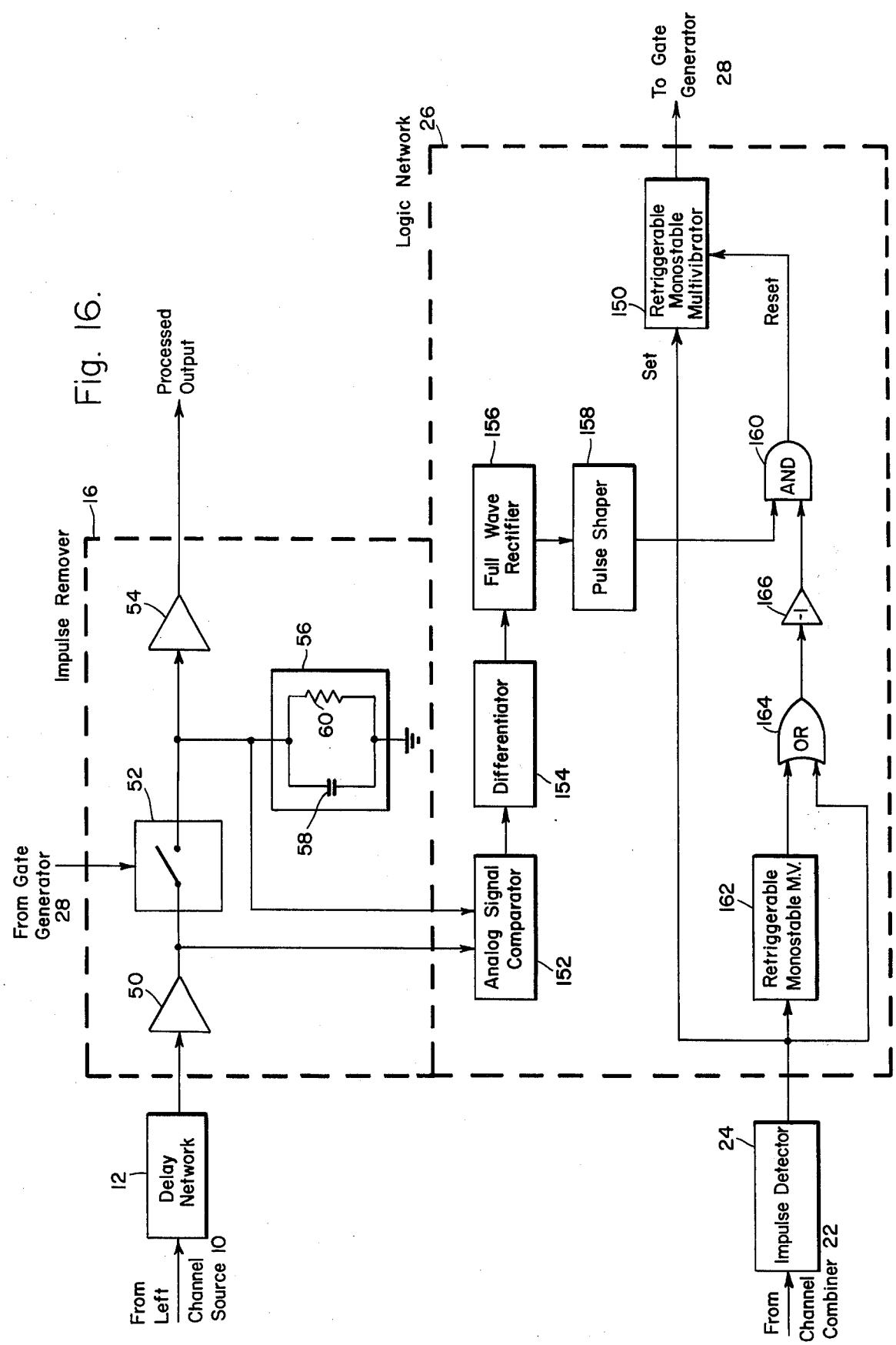
Figure 17:
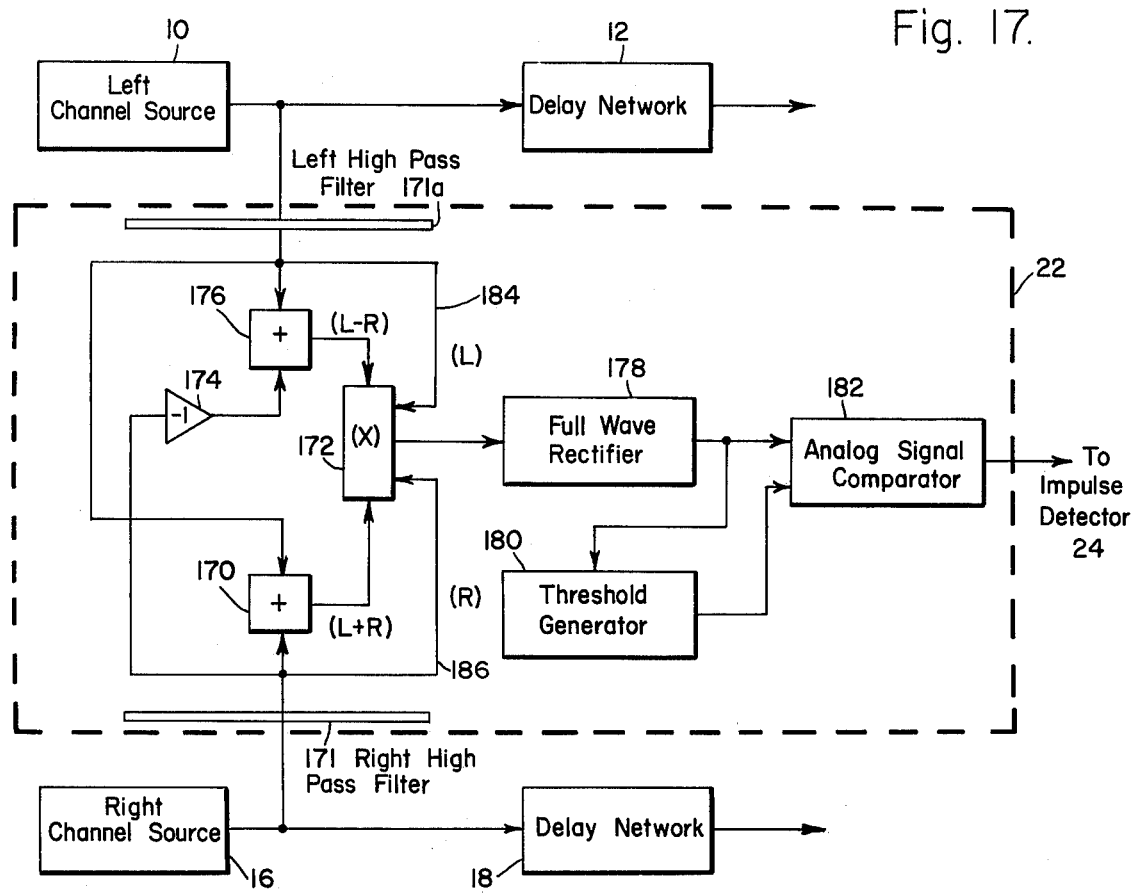
Figure 18:
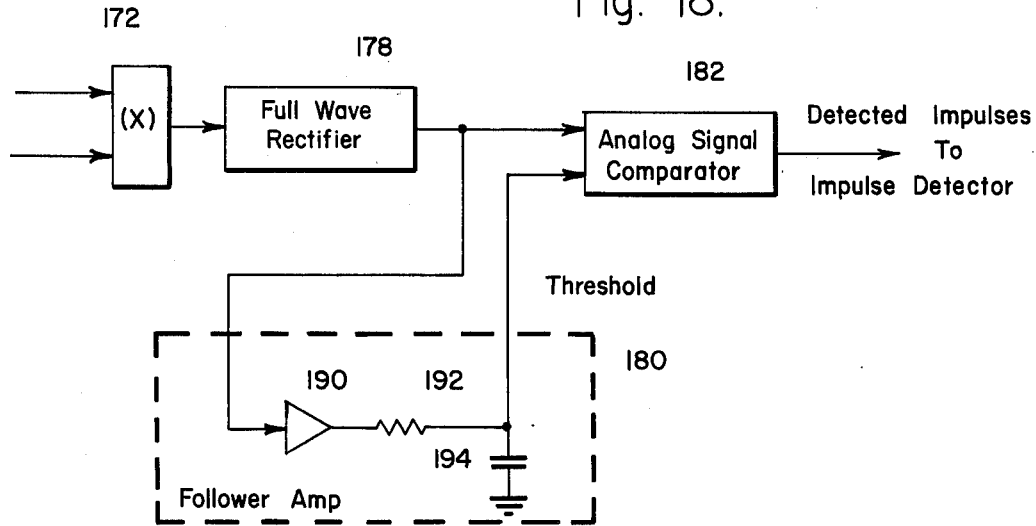
Figure 19:
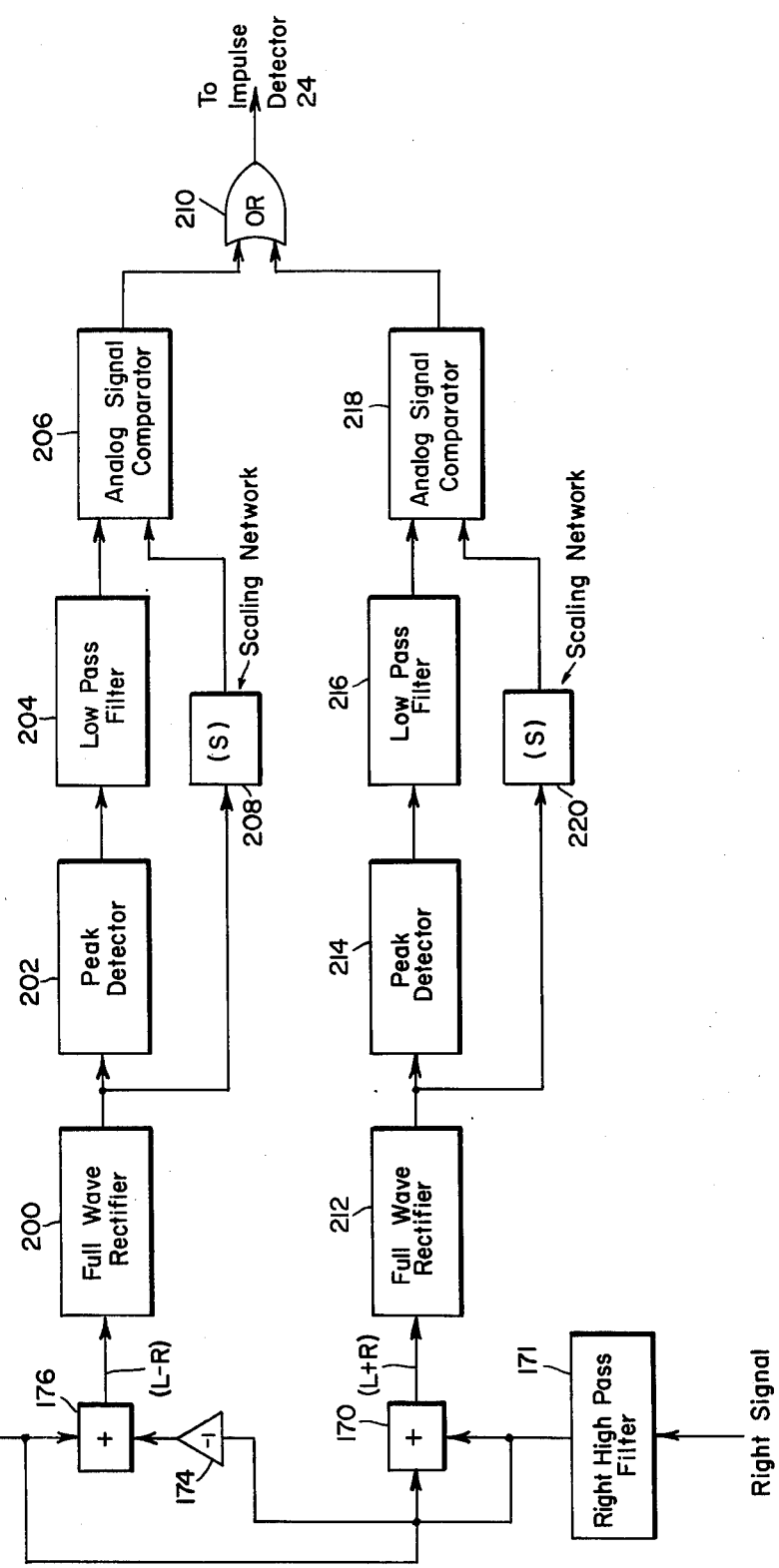
Figure 20:
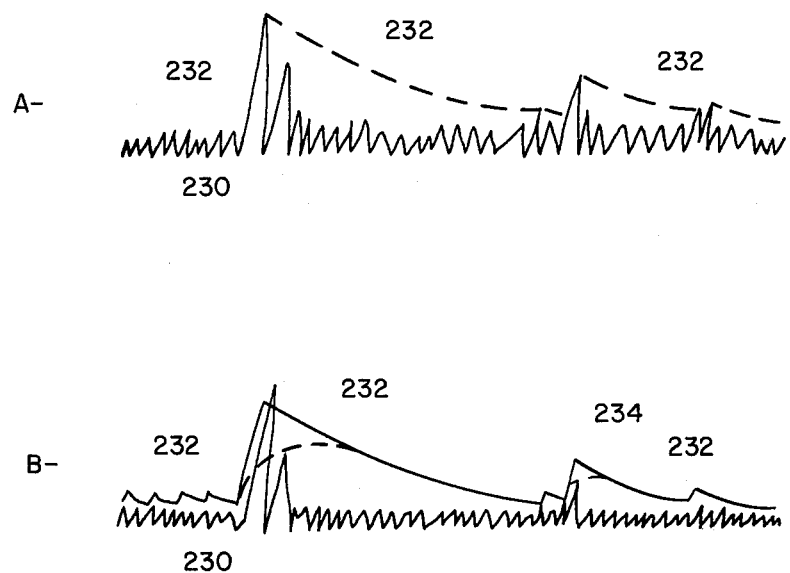
Figure 21:
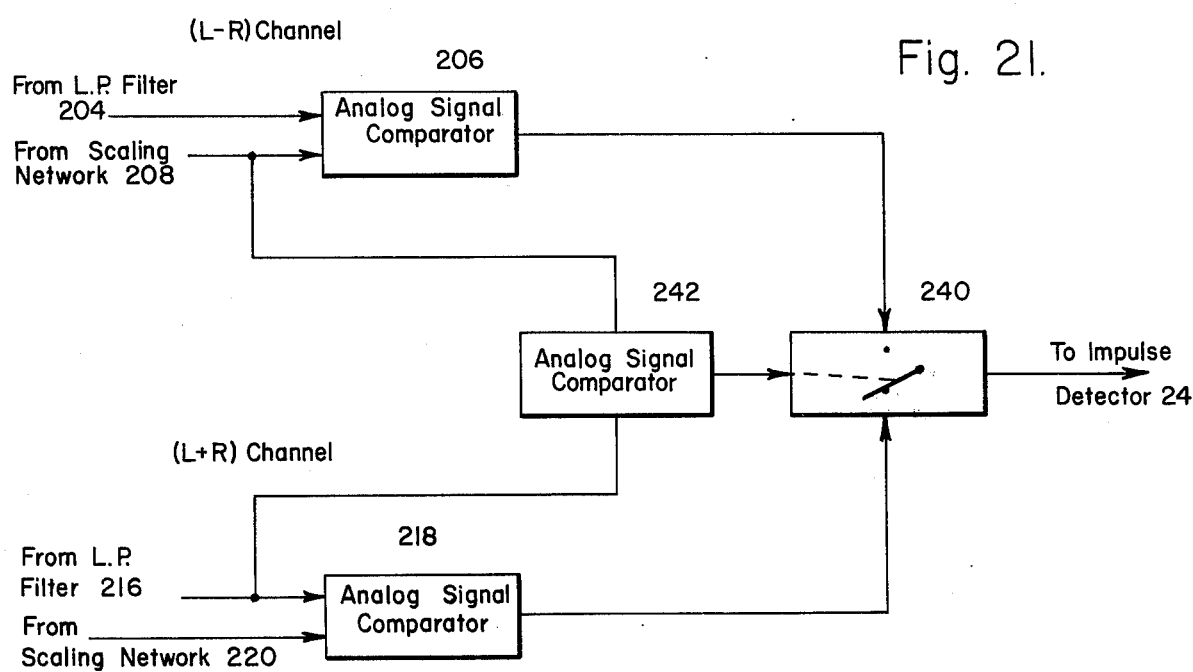
Figure 22:
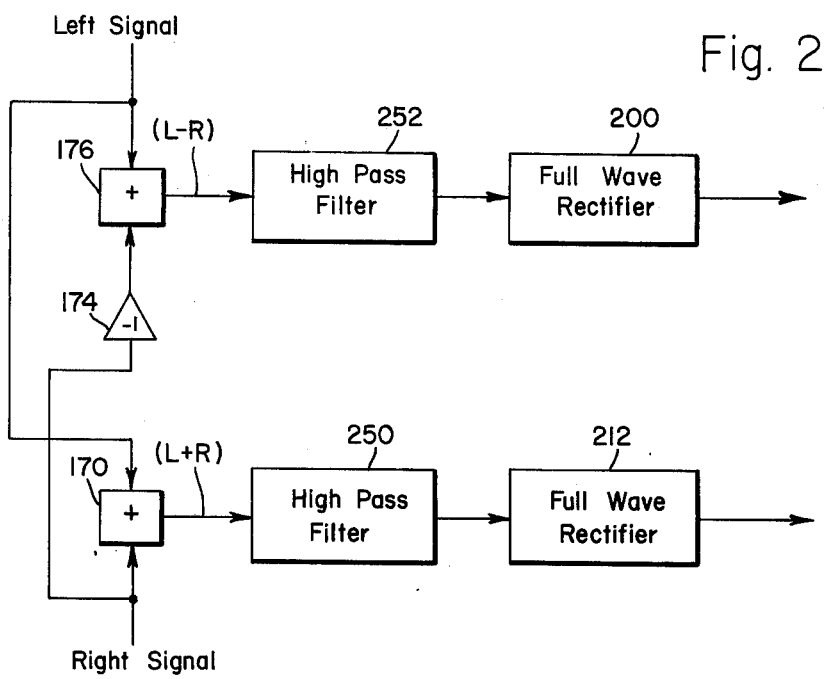
Figure 23:
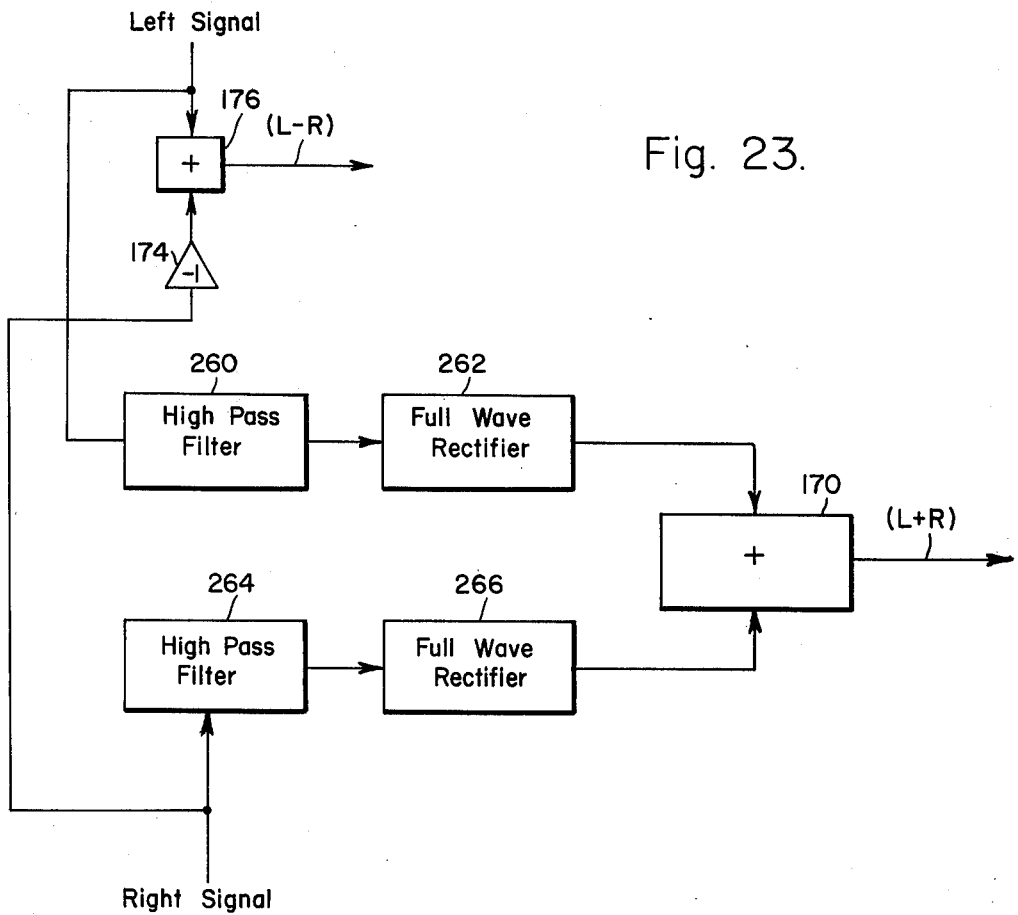
Figure 24:
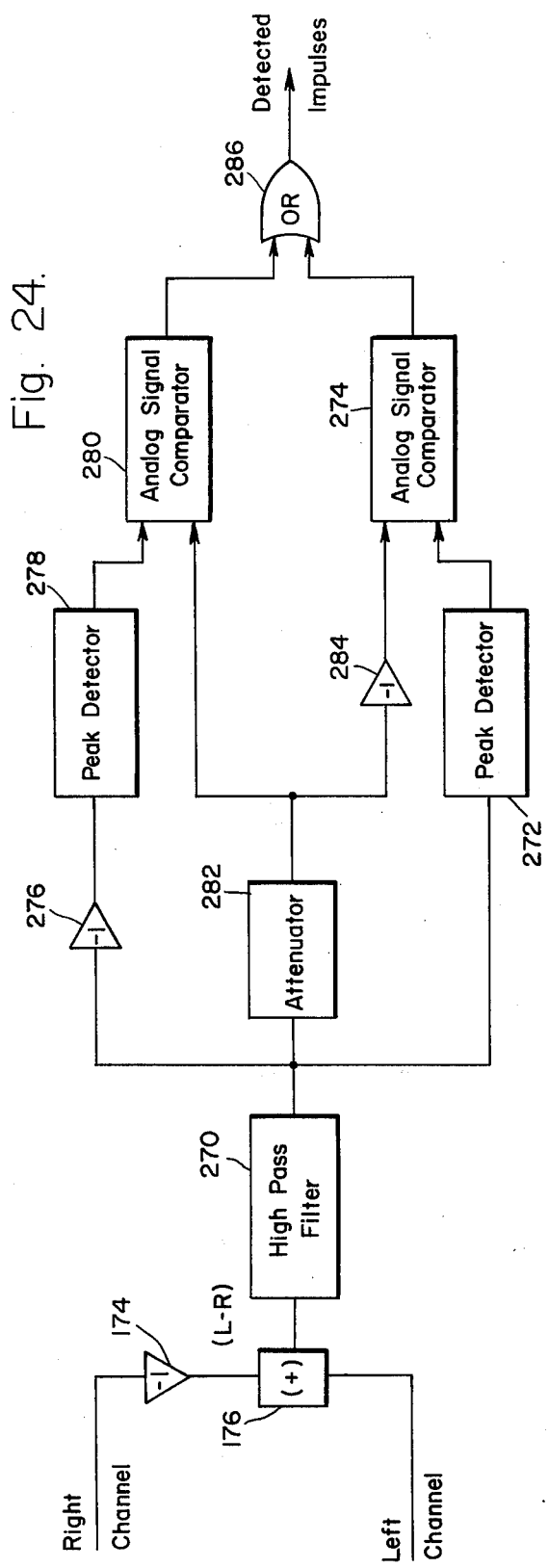
Figure 25:
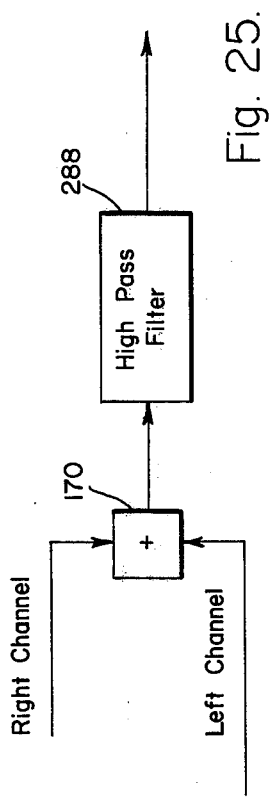

FIG. 15 (a), (b) and (c) are waveforms illustrating the signal removal schemes illustrated in connection with FIGS. 13 and 14;

FIG. 16 is a block diagram illustrating a logic network in combination with exponential signal decay insertion techniques illustrated in connection with FIG. 11;

FIG. 17 is a block diagram of a channel combiner used in the noise detecting circuit;

FIG. 18 is a block diagram of a typical threshold detector;

FIG. 19 is a block diagram of an embodiment for detecting noise signals without using a multiplier;

FIG. 20, including A and B, is a series of waveforms illustrating peak detector techniques illustrated in connection with FIG. 19;

FIG. 21 is a block diagram illustrating a modification of the circuit illustrated in FIG. 19;

FIG. 22 is a block diagram of a separate tic and pop detector;

FIG. 23 is a block diagram of an alternate embodiment for a tic detector;

FIG. 24 is a block diagram of still another embodiment illustrating an impulse detector system for tics or pops; and FIG. 25 is a block diagram illustrating a noise detector system for pops.

Referring now to FIG. 1 there is shown a conceptual block diagram of a noise reduction system. An important feature of the system for detecting undesired signals is based on the fact that a pair of correlated (wholly or partially) signals is generated by the record medium. Since there is a basic signal correlation and anti-correlation of noise, it is possible to make a far superior separation of the noise from the signal by substantially attenuating the signal without substantially attenuating the noise and thus materially improve the probability of detecting noise on its leading edge while reducing the false alarm rate. In this manner it now becomes possible to detect the noise or undesired signal even in the presence of large amplitude desired signals.

The pair of correlated signals are generated by utilizing a conventional stereo pickup head for either stereo recordings or monaural recordings. The output of the stereo pickup sensors is modified by combining the output of the two pickup sensors in inverse phase, the resulting signal to be used in the noise pulse detection circuits only.

The significance of reversing the phase of one of the pickup sensors and combining the output will be made more apparent when it is recalled that the industry originally had problems in making a conventional stereo pickup head compatible with the playing of a monaural record. The groove on a monaural record generates movement in the horizontal plane and the utilizing of a stereo pickup record with two sensor elements at 45° to each other produced both vertical components and horizontal components in each output sensor. Since the signal component existed only in the horizontal component of the output sensors, it was discovered that the turntable rumble signal was being generated mainly as a result of the vertical components from each of the sensors being detected and amplified through the amplifier system.

The problem was solved and compatability between stereo pickup sensors on monaural records was achieved by designing the system so that the vertical component in both channels will be out of phase when the horizontal components are in phase. In other words, the pickup sensors in responding to record groove motion perpendicular to the element will generate vertical components and horizontal components; however, only the horizontal components will generate a signal since the vertical components will be effectively cancelled and elminated.

In a monaural system the pair of substantially totally correlated signals are generated by conventional stereo pickup sensors for generating identical left and right signals. The output from the pair of sensors are combined in phase opposition whereby the horizontal components representing the desired signal in each channel are substracted and the vertical components representing the undesired signals are enhanced.

In a stereophonic system the left and right channel output signals are generated by a conventional stereo pickup head in the conventional manner. In view of the significant correlation between the left and right signal and the fact that the noise anti-correlation is also apparent on the left and right signal, it is now only necessary to subtractively combine the left and right signal in order to enhance the amplitude of the undesired signal relative to the desired signal.

The undesired signal results primarily from external matter such as dust and particles resting in the grooves and also damage to the groove itself by means of gouging that results from some external use or misuse of the record. The gouge on the record appears to run across the groove at some angle and is viewed by the stylus tracking the groove mainly as a large vertical movement. Depending on the size of the gouge, it is apparent there will be a horizontal effect also but experience has verified that the main effect of the gouge is in the vertical direction. Experience has shown that combining the output of the stereo pickup sensors out of phase with each other results in the amplification and enhancement of the large primarily vertical movement associated with gouges, making them easily detectable in the presence of the desired signal. The smaller gouges in which the movement generates a significant horizontal as well as a vertical component are sometimes more easily detected when the output of the two pickup sensors are added or combined in phase. For the most complete detection of undesired signals, it is apparent that the output signals from the individual pickup sensors be combined both out of phase and in phase in order to detect substantially all of the undesired signals.

Referring more specifically now to FIG. 1 there is shown a left channel source 10 comprising a left channel input and pre-amplifier which feeds the left channel signal to a delay line 12 and ultimately to an impulse remover 14. The output of the impulse remover 14 is the left channel output and feeds the conventional power amplifier and transducer system.

Similarly the right channel comprises a right channel source 16 consisting of a right channel input and pre-amplifier feeding a delay 18 that is similar to delay 12 which in turn feeds an impulse remover 20 which operates in response to an externally generated gate signal. The output of the impulse remover 20 is the right channel output feeding the right channel amplifier and transducer system.

The noise detector channel comprises a channel combiner 22 capable of receiving sound correlated signals from the left channel source 10 and the right channel source 16. The channel combiner 22 is preferably capable of adding the sound correlated signals from the left and right channels both in phase and out of phase in order to thereby enhance the undesired signal and attenuate the desired signal. As will be demonstrated later, it is possible for the channel combiner 22 to be comprised of a plurality of individual combining means that add in phase, out of phase, and multiply the products so as to develop a plurality of individual outputs based upon the correlated signals from channels A and B to thereby enhance the undesired signals for detection. Each of the outputs from the channel combiner 22 is fed to an impulse detector(s) 24, capable of detecting impulse noise or undesired signal. The output of the impulse detector 24 is fed to a logic network 26 that may either be fixed networks or adaptive networks capable of determining the priority and logically combining the individual detected signals from the impulse detectors 24. The output of the logic network 26 feeds a gate generator 28 which feeds both impulse remover 14 in the left channel and impulse remover 20 in the right channel and thereby in response to the output of the logic network 26 is capable of generating an On and Off gating signal to each of the impulse removers 14 and 20 thereby turning the individual channels On and Off as determined by the detected noise signal. The gate signal generated by gate generator 28 is actually triggered by the leading edge of the detected undelayed undesired signal. The length of the gate signal is preferably made greater than the width of the detected undesired sound signal and may either be fixed in length or made adaptive to the width of the detected signal.

The delay network 12 in the left channel and the delay network 18 in the right channel should have identical fixed delays which need only be long enough to remove the detected undesired signal. This delay may vary from 25 microseconds to a maximum of several milliseconds depending on conditions and applications.

The logic network 26 takes the outputs from the various channels that are doing the detection and combines them in some predetermined manner which takes full advantage of the statistical nature of the problem in order to obtain an optimum result. For example, the logic network may determine that a detection of a noise signal is only valid when detected in both the A and B channels. The logic network may be any combinations of Or gates and And gates necessary to determine the logical result required. In the broad concept a plurality of gate generators 28 may be used under the control of individual logic networks 26 and actually there is no limit to the kind of gates used. The logic network 26 will therefore work in conjunction and control the individual gate generators 28 as determined by the needs of the system.

Referring now to FIG. 2 there is shown a block diagram of a noise detector and signal substituter having the capability of replacing the removed undesired signal with a signal that is not objectionable to the listener and, further, that does not introduce additional objectionable signals during the insertion process.

Referring now to FIG. 2, there is shown a conceptual block diagram similar in many respects to that shown in FIG. 1 but which in addition illustrates a signal substituter 30 which receives input information from the signal combiner 22, the logic network 26 and gate generator 28.

The input signal from the signal combiner 22 signals detection of an undesirable signal. The output from the logic network 26 indicates which channel will receive a gating signal and the output of the gate generator 28 indicates the generated gate signal being fed to either of the impulse removers 14 or 20 located in the left and right channels respectively. The signal substituter 30 will therefore insert an audibly acceptable substitute signal within the limits of the gate pulse generated by the gate generator 28.

In the broadest concept of this invention the signal substituter may consist of a computer having prerecorded memory information concerning data already recorded on the record medium, and information compatible with data removed from the individual channels could be inserted in real time to eliminate the hiatus resulting from gating out a portion of the individual channels. While such a solution is feasible it is recognized that the cost and implementation would be prohibitive and hence is included for completeness only.

The very act of gating out a portion of the channel leaves a hiatus in the sound channel which represents a discontinuity that can be heard and may be objectionable.

In addition, the very act of gating the sound channel first into an Off condition and then into an On condition has the effect of generating sharp leading edge spikes and trailing edge spikes that are audible as noise. It is most important therefore that gating of the individual sound channels be processed in such a manner that trailing edge and leading edge spikes are not generated.

The prior art has recognized these problems and aside from reconstituting and regenerating a record medium by means of computer processing has not been able to generate a noise detector system in real time that is capable of eliminating the problems set forth above. For example, the prior art techniques have suggested using a 6 millisecond delay after detecting a sharp rising leading edge pulse in order to determine if the detected signal is noise or desired signal.

Notwithstanding the problem associated with a 5 to 6 millisecond delay, the prior art has suggested that at the time of gating the channel into an Off condition the last level of signal be held until the channel is again gated into an On condition as a means of filling the hiatus. Unfortunately, the difference in the signal level between the held value and the signal level at the time the gate is turned on represents an impulse which is easily detected and heard as an offending or undesired signal.

The present invention will disclose two embodiments for "surgically" inserting an audibly acceptable signal within the gated portion so as to fill the hiatus caused by the gate and, further, to eliminate objectionable noises heard during the gating On and Off times.

Both systems implement the inventive concept which is the recognition that at the time of gating the channel On and Off that the inserted signal must start and end at the same level of the desired signal. In other words, at the time of the Off gate the inserted signal must start at the level of the desired signal and end on the desired signal at the time of the On gate. Fulfilling these criteria allows the gate to remove the offending signal without generating spikes during the On and Off time and, further, provides the means for inserting a signal within the hiatus. Both of these embodiments will be more fully described later in connection with the signal substituter 30 illustrated in FIG. 2.

Creating a 5 to 6 millisecond hiatus in the sound channel would be highly objectionable and detectable by the ear. In addition, according to present day techniques before the advent of the present invention, it would be impossible to create a hiatus in the sound channel without also creating the objectionable spikes at the gating points of turning the signal On and Off.

According to the present invention, experiments have shown that a hiatus in the sound channel of up to 5 milliseconds is now tolerable because of the manner in which the hiatus is filled and the sound channel is gated On and Off.

In one embodiment the level of the signal at the time the gate generator 28 generates a first pulse to turn a channel Off also signals the signal substituter 30 to hold the last level of the delayed signal and allow the signal to decay at a natural rate. In this fashion the Off pulse generated by the gate generator 28 will not create an objectionable spike or signal since the sound channel will be held at the same level that it was the instant the gate signal was generated. In the usual case the sound channel is removed from a given value to zero and the act of abruptly changing the level of the signal in the channel is what generates the objectionable noise. In the present invention the level of the last signal is held and allowed to decay at a natural rate thereby eliminating the possibility that an objectionable noise spike will be generated.

The termination of the gate as determined by the gate generator 28 will be logically determined by the logic network 26 and may consist of a fixed time or be adaptively controlled by the level of the signal channel itself. In any event, the signal substituter 30 will control the output of the gate from gate generator 28 by limiting the output signal from the gate generator until the level of the decaying signal held by the signal substituter 30 is equal to the level of the signal in the individual channel. At that time the gate generator 28 is allowed to generate a signal terminating the gate and allowing the channel to continue transmission of the sound signal.

It will be remembered that since the gate generator 28 is inhibited against generating an On signal or gate terminating signal until the level of the sound in the individual channel is equal to the level of the decaying signal held by the signal substituter 30 that in such an event an output from the gate generator will place the individual channel into an On condition without a change in signal level in the individual channel, thereby eliminating the possibility that an objectionable signal or spike will be generated during the gated On signal.

A review of the operation will show that the output of the gate generator in turning the individual channel Off occurs without interfering with the signal level at that time and, further, that the output of the gate generator in turning the individual channel On also occurs without interfering or changing the level of the signal in the channel.

The operation of the block diagram illustrated in FIG. 2. will be made more apparent by referring now to the waveform diagrams illustrated in FIGS. 3, 4, 5, 6, 7, 8, 9 and 10.

The waveforms illustrated by FIGS. 3 through 10 are drawn in time sequence with respect to one and the other in order to more fully illustrate how the undesired signal is detected and removed from the delayed channel.

FIG. 3 illustrates an undelayed signal and could appear either at the output of left channel source 10 or right channel source 16. The spike portions 32, 34 and 36 represent undesirable signals impressed upon the desired signal train 38 by means of external influences on the record medium.

FIG. 4 shows the waveform at the output of the impulse detector 24. In view of the action of the signal combiner 22 the general level of the desired signal train 38 has been attenuated and the undesired signals, namely 32, 34 and 36, have been enhanced for detection purposes.

The action of the impulse detector 24 includes full wave rectifying means and the waveform illustrated in FIG. 5 illustrates how the individual undesired signals 32, 34 and 36 have been rectified. In view of the enhancement of the undesired signals a horizontal line indicating threshold level has been inserted to show a signal detection level.

The waveform illustrated in FIG. 6 shows the effect of the threshold level of FIG. 5 and illustrates how gating signals are generated based upon the steep leading edge of the individual undesired signals 32, 34 and 36.

FIG. 7 illustrates a gating signal generated by the detected leading edge of the undesired signal 32 which has resulted in a minimum length gate as determined by the logic network 26. The gate generator 28 actually generates the gating signal. The actual gate generated by the gate generator 28 will have a width greater than that shown in FIG. 7 because of the interaction of the signal substituter 30 on the gate generator 28.

Referring now to FIG. 8 there is shown a delayed version of the desired signal that would appear at the output of either delay network 12 or delay network 18. A comparison of the curve illustrated in FIG. 8 and that illustrated in FIG. 3 will show that the curves are identical but displaced in time as determined by the action of the delay networks 12 or 18. FIG. 8 more fully illustrates how the steep leading edge 32 of the first undesired signal generates the leading edge of the gate signal generated by gate generator 28 to turn the channel into an Off condition. The signal level of signal 38 is not reduced to zero but rather is held at the last level by the signal substituter 30 and allowed to decay at an exponential rate as shown by curve 40.

The fluctuations of the delayed undesired signals 32A, 34A and 36A continue until the amplitude level of the delayed signal 38 is equal to the decayed value of the exponentially decaying signal 40 as shown at 42. The gate generator 28 is allowed to generate the gating signal to the individual impulse remover 14 or 20 thereby allowing the channel to generate the conventional signal output. It will be appreciated therefore that the actual width of the gate generated by the gate generator 28 has a minimum value as determined by the logic network 26 but is adaptively controlled by the output of the signal substituter 30 to terminate only when the decay value of signal 40 is again equal to the value of the delayed signal 38. In this fashion the gate generator 28 will not cause any undesirable noise signals by the act of gating the signal into an On condition or an Off condition since the generated gate signals will not initially change the voltage level of the signal at the time the gate signals are generated.

Referring now to FIG. 9 there is shown a gate signal 44 which represents the actual output of the gate generator 28.

Referring now to FIG. 10 there is shown the actual signal 38 containing the "surgically" inserted portion 40 that has been inserted to take the place of the offending noise signals 32, 34 and 36. The waveform illustrated in FIG. 10 represents the actual channel output signal appearing at either the output of channel A or channel B.

Referring now to FIG. 11 there is illustrated a block diagram for implementing either impulse remover 14 or 20 illustrated in FIGS. 1 and 2. The embodiment illustrated in FIG. 11 represents the technique for maintaining the signal level when the gate signal is received and allowing that signal level to decay exponentially. Removal of the gate signal is occasioned adaptively when the exponentially decaying inserted signal is again equal to the incoming signal voltage after the minimum gate time has elapsed.

In the absence of receiving an undesirable signal the unprocessed signal input is received from either delay network 12 or delay network 18, depending on whether the impulse remover is in the left or right channel. The delayed signal is amplified by amplifier 50 and fed through a normally closed high speed electronic switch 52 to a second amplifier 54. The output of amplifier 54 represents the processed signal output of the individual channel in question.

The high speed electronic switch is controlled by the output of the gate generator 28 illustrated in either FIG. 1 or 2. Located between the output of the high speed electronic switch 52 and the input to amplifier 54 is a discharged circuit 56 comprising a parallel combination of a resistor 58 and a capacitor 60 connected together at one end to the junction between the high speed electronic switch and the amplifier 54 and at the other end to a ground connection. The resistor 58 and the capacitor 60 in circuit comprise a discharge circuit, the decay time of which is calculable by measuring the resistance and the capacitance commonly known as the RC time constant.

In the normal operation the high speed electronic switch 52 is closed and the output impedance of the amplifier 50 is low enough to allow capacitor 60 to charge up to the instantaneous voltage located at the output of amplifier 50. In other words, the voltage on capacitor 60 will instantaneously follow the varying voltage at the output of the amplifier 50.

In the event a noise detection circuit is energized, the gate generator 28 will generate a gate signal which will open the high speed electronic switch 52. At this point in time the voltage on capacitor 60 will begin to exponentially discharge through resistor 58. Since the opening of the high speed electronic switch 52 did not change the input voltage feeding amplifier 54, there is therefore no spike or noise signal generated by the operation of the high speed electronic switch 52. The voltage feeding the input to the amplifier 54 will therefore be a continuing exponentially discharging voltage on capacitor 60 being discharged through resistor 58 to ground.

The termination of the gate signal from the gate generator 28 will be determined by the signal substituter 30 illustrated in FIG. 2 at the time when the received unprocessed delayed signal is again equal to the value of the instantaneous voltage appearing across the capacitor 60. At that time the high speed electronic switch 52 is closed and the unprocessed delayed signal from amplifier 50 is allowed to pass through amplifier 54 in a conventional manner. Capacitor 60 will again charge up and follow the instantaneous value on the incoming signal from amplifier 50 as before. The process will then repeat itself whenever the electronic switch 52 is energized in response to the detection of an undesired noise signal.

Referring now to FIG. 12 there is shown a more complicated system for generating a reconstituted signal during the gated off portion as determined by the output of the gate generator 28 in FIG. 2. FIG. 12 is actually a more detailed block diagram of that portion of FIG. 2 which illustrates the delay network 12 feeding the impulse remover 14 and the signal substituter 30. The system illustrated in FIG. 12 is still another embodiment for filling in the gap during the time that the delayed signal is gated off by the gate generator 28. It will also be appreciated that FIG. 12 only illustrates that portion of the signal substituter 30 cooperating with the left channel and that for completeness the embodiment illustrated in FIG. 12 must be duplicated in order to fully process the right channel. As mentioned previously the left and right channels in a stereo record medium, while correlated, are not necessarily equal and hence the need for processing each channel individually. In a monaural record played by a stereo pickup, the generated channels A and B are not only correlated but also identical and hence in that situation a single signal substituter 30 would serve both channels.

The embodiment illustrated in FIG. 12 utilizes well known phase lock loop techniques for generating a clean signal that is a reasonable copy of the usually dominant mid range of the fundamental frequency of the signal channel.

The signal substituter 30 comprises an automatic gain control loop consisting of a high pass filter feeding a hard limiter in the form of a zero crossing detector 78. The high pass filter 76 prevents the passage of the lower frequencies and insures that the main or mid range fundamental frequencies in the received signal are transmitted to the zero crossing detector. The zero crossing detector 78 will therefore generate an output signal based upon the zero crossings of the main or fundamental components of the received signal to a frequency to voltage converter 80 that acts as a discriminator which in turn feeds a low pass filter 82 for smoothing the output voltage that is used to control a variable narrow band filter 84. By way of review, the automatic gain control loop (AGC) generates a DC voltage for controlling the frequency band pass of a variable narrow band filter 84 in response to the detected mid range fundamental frequency in the received signal.

The second loop is basically a frequency and phase locked loop which consists of the delayed signal from the delay network 12 feeding the variable narrow band filter 84 which has a band pass that varies in response to the detected signal from the low pass filter 82. The output of the variable band pass filter 84 feeds a variable phase shifter 86 which generates an output signal that is fed both to a first input of a phase detector 88 and to the normally open terminal 90 associated with an electronic switch identified as part of the impulse remover 14.

The phase detector 88 receives a second input from the delayed signal generated by the delayed network 12. The output of the phase detector 88 is a variable voltage depending on the phase difference between the output of the variable phase shifter 86 and the phase of the incoming signal from the delay line 12. The phase detector 88 feeds a low pass filter 94 and has the effect of smoothing out the voltage which is then fed to the variable phase shifter 86.

Under normal conditions in the absence of any detected undesirable pulses, the output of the variable phase shifter 86 will be a substantially clean signal following the main component of the signal appearing in the output of the delay network 12.

The detection of an undesirable signal will take place as described in FIGS. 1 and 2 and will result in the generation of a gate from the gate generator 28 in FIG. 2 to the impulse remover 14 that has the effect of transferring the normally closed contact point of the high speed electronic switch 92. In order to eliminate any possibility of generating noisy signals at the time of gating the high speed electronic switch 92, the output terminals from the signal substituter 30 to the logic network 26 of FIG. 2 also insures that the gate signal generated by the gate generator 28 of FIG. 2 will switch the high speed electronic switch 92 only on the zero crossings.

At the time the high speed electronic switch 92 is operated the output of the variable phase shifter 86 is placed on the line and fed as the processed signal output. This output signal basically represents a reasonable copy of the mid range fundamental component of the received signal and represents a substituted signal having many of the desired components of the incoming signal.

Referring now to FIGS. 13 and 14, there is illustrated still another embodiment for inserting a synthesized signal in the interval when a noise pulse is detected.

As mentioned previously, detecting the objectionable noise pulse is only one step of the process since by definition the objectionable noise signal is a transient signal and simply providing a discontinuity in advance of the objectionable signal will by the very nature of stopping the desired signal for a pulse length of time equal to the length of the undesired signal present a transient condition that may actually be worse than the undesired signal produced originally. The problem therefore is to not only remove the undesired signal but also to remove the undesired signal in such a way that undesired transient conditions are not generated which render the cure worse than the disease. In addition, it has been considered most desirable to replace the removed portion with a synthesized signal having none of the objectionable qualities of the undesired signal and that is compatible with the desired signal.

The embodiments illustrated in FIGS. 13 and 14 continuously measure the slope of the incoming signal. At the instant the pulse detecting system detects an undesired signal and interferes with the desired signal train, the synthesizer generates an output signal having substantially the same slope as the input signal at the moment the signal was interfered with. At termination of the gate pulse, the slope of the output signal is free to follow the varying slope of the input signal.

In FIG. 13 the input signal is fed to a delay mechanism 100 which feeds a differentiator circuit 102. The output of the differentiator circuit 102 feeds an isolation amplifier 104 which in turn feeds a normally closed high speed switch 106 that is gated open in the presence of a signal gate from the noise pulse detecting schemes described previously. The output of the normally closed switch 106 feeds a zero order hold circuit comprising a capacitor 108 feeding an integrator circuit 110, the output of which feeds an isolation amplifier 112 for producing a signal output.

A review of FIG. 14 will similarly show a system comprising a signal input feeding a delay mechanism 120 feeding a differentiator circuit 122 which in turn feeds a normally closed high speed switch 124 controlled by the gate circuit previously described. The output of the normally closed high speed switch 124 feeds a zero order hold circuit comprising a capacitor 126 and an integrator circuit 128 which generates the desired signal output.

A review of FIGS. 13 and 14 will show that the desired signal after being delayed is fed to a differentiator which continuously differentiates the input signal which generates a voltage appearing on the zero order hold capacitor, either 108 or 126, as the input signal varies. The output of the zero order hold capacitor 108 or 126 is continuously integrated thereby generating a signal output having the same characteristics as the signal input that was previously fed to either differentiator 102 or 122.

In the event a noise signal is detected and the gate switch control is energized, the normally closed high speed switch 106 or 124 will open thereby immediately removing the differentiated input signal from either capacitor 108 or 126. The voltage appearing on capacitors 108 or 126 will therefore be a voltage representative of the differentiated input signal at the time the switch was opened. In other words the remaining voltage on the capacitor will be a voltage that is indicative of the slope or change of the incoming signal at the time the normally closed high speed switch was opened. The output of the integrator 110 or 128 when the normally closed high speed switch 106 and 124 is opened will continue to generate a ramp at the same slope that the input signal had just prior to the opening of the switch and will continue to do so until the high speed switch 106 or 124 is again closed as determined by the gate control circuit.

Upon review it will be appreciated that over millisecond intervals the slope of the output signal will be the same when the normally closed switch 106 or 124 is closed as it was when the normally closed switches were opened and a noise signal was first detected. In this fashion the output signal does not contain any initial discontinuities or transients. At the moment the normally closed high speed switch 106 or 124 is again closed after the passage of the undesired signal, the individual capacitors 108 and 126 will immediately charge to the new differentiated value of the then new input signal. However, the integrator circuit 110 or 128 cannot initially change to a new voltage value but rather will simply charge to the new voltage value at a different slope represented by the new value on the input capacitor. In other words, the capacitor of the integrator circuit will simply charge to a new value at an increased rate. The slope of the output will change but there will not be any abrupt step in the output signal. It is similar to the action of placing a filter on the output since the filter cannot respond instantaneously to a change in the input. The change, if at all, must be made gradually and smoothly.

Referring now to FIG. 15A there is shown a curve 130 representing a signal input having a noise pulse 132.

FIG. 15B illustrates the effect of differentiating the input signal and the effect of generating positive going spikes 134 and negative going spikes 136 corresponding to the steep wave fronts on the noise pulse 132.

FIG. 15C illustrates the gate pulse 138 which is generated in real time and applied to the normally closed high speed switches 106 and 124 illustrated in FIGS. 13 and 14 to thereby open the switches and prevent the undesired noise pulse 132 from passing through the system.

A review again of FIG. 15A will show that curve 140 which represents the output signal maintains a constant slope output signal at the instant the gate pulse is initiated and at the instant the gate pulse is terminated. The output signal 140 will attempt to follow the input signal after the high speed switch 106 and 124 have closed; however, for a short period of time there will be a DC offset that will eventually smooth out due to the coupling capacitors located in integrators 112 and 128. Listening tests have shown that the system illustrated in FIGS. 13 and 14 represents an inexpensive scheme for removing undesirable noise signals at the expense of introducing a small DC offset, as is illustrated in FIGS. 15A.

Referring now to FIG. 16 there is shown a block diagram illustrating a logic network 26 cooperating with the exponential decay signal insertion technique illustrated in FIG. 11.

The logic network illustrated in FIG. 16 is illustrated in connection with FIG. 11 and FIG. 1 for only the left channel. As explained previously, it will be necessary for the logic network to be duplicated for the right channel in a complete stereophonic system. The detection of the noise signal will generally take place on the leading edge or rising wavefront of the noise signal for both the right and left channels. It must be remembered that the left and right channels are not identical but only correlated and in view of the difference in sound signals, separate gate termination logic techniques must be used. It is possible however to use a single gate termination logic network; however, the advantages of the claimed system will of course be compromised. This of course is not true when playing a monaural recording since the generated left and right signals will in that case be identical and hence a single channel compatible for both the left and right generated channels may be used.

The impulse remover 16 is substantially identical with that illustrated in connection with the exponential decay signal insertion technique illustrated in connection with FIG. 11. It is essential in the practice of the invention to generate the gate signal without affecting or changing the original signal voltage at the application of the gate signal and also to insure that the termination portion of the gate signal occurs only when the incoming signal is equal to the decaying signal after the passage of the minimum gate width.

The logic network 26 contains a resettable monostable multi vibrator 150 that is fed directly to the gate generator 28. The output of the impulse detector 24 is fed directly to and sets the retriggerable monostable multi-vibrator 150. The impulse detector 24 will be activated by the leading edge of the detected noise signal illustrated as signal 32 in FIG. 6. The width of the output gate signal will be determined in part by the width of the retriggerable monostable multi vibrator 150 which is in effect a single shot multi vibrator having a minimum pulse width and which is triggered at all times only by the leading edge of the detected noise signal. The output signal from the retriggerable multi vibrator is more fully illustrated in FIG. 7 as a gate signal having a minimum width but always starting on the leading edge of the detected noise signal.

The logic network will ultimately reset the multi-vibrator 150 after the minimum pulse width and only when the incoming signal from the delay network 12 is equal to the exponentially decaying signal that is inserted during the gate period.

A review of FIG. 1 will show that energizing the gate generator 28 causes a gate signal to be fed to the impulse remover 16 and specifically to the normally closed high speed electronic switch 52 which is then opened. Opening the high speed electronic switch 52 causes the voltage on capacitor 58 which has been closely following the output signal from amplifier 50 to be impressed on the input of output amplifier 54 and fed as the processed output signal. The output signal on capacitor 58 exponentially decays through resistor 60 thereby feeding an exponentially decaying signal through amplifier 54.

An analog signal comparator 152 located within the logic network 26 samples the differential voltage across the open electronic switch 52 and generates an output signal to a differentiator 154. The output signal from the comparator 152 will be a varying signal since the incoming signal will be varying according to the signal source whereas the output signal on the other side of the switch 52 is a decaying signal and hence the signal may be varying in an upward or downward direction and it is necessary to use the trailing edge of the signal as the means for ultimately resetting the multi-vibrator 150. The differentiator 154 will generate spikes in both an upward and downward direction and hence the output of the differentiator 154 is fed to a full wave rectifier 156 and ultimately to a pulse shaper 158. The ultimate signal being used to reset the multi-vibrator 150 will be the spike voltage representing a true comparison between the incoming voltage and the decaying voltage but at a time after the minimum width of the pulse has generated by the multi-vibrator 150. It will be remembered that the varying incoming signal from the delay network 12 feeding amplifier 50 will generate a varying voltage that statistically will equal the decaying voltage on the other side of the switch 52 and hence generate many output signals from the analog signal comparator 152. The purpose of the analog signal comparator 152 and differentiator 154 and full wave rectifier 156 and pulse shaper 158 is to generate usable pulses when the compared signals are the same regardless of the polarity and hence the reason for the full wave rectifier 156. The output of the pulse shaper 158 will therefore be a pulse occurring when the compared signals are the same across the high speed switch 52 regardless of polarity. The output of the pulse shaper 158 feeds an And gate 160 which feeds the reset terminal on the multi vibrator 150.

In order to insure that the output of the pulse shaper 158 indicating a true comparison does not prematurely reset the multi-vibrator 150, it is necessary that an inhibiting circuit be used to insure that the And gate 160 does not generate a signal until after the required minimum time elapses in order to thereby allow the noise pulse to pass through the system before the electronic switch 52 is again operated into a normally closed position.

The impulse detector 24 also feeds a retriggerable monostable multi-vibrator 162 that is triggered by the same leading edge noise pulse that sets multi-vibrator 150. In the preferred embodiment multi-vibrator 162 may be set to provide a delay of 25 to 500 microseconds. The output of multi-vibrator 162 feeds an OR gate 164 that also receives an input directly from the output of the impulse detector 22 in order to insure that any signal regardless of duration or amplitude is used to generate an output signal from the OR gate 164. The OR gate 164 output is inverted by inverter 166 the output of which feeds And gate 160.

The And gate 160 will therefore generate a reset signal to multi-vibrator 150 only after the minimum period of time determined by multi-vibrator 162 and then only when the comparison signal is also received from the pulse shaper 158 located in the comparison circuit. At that time and only after that minimum period of time, multi-vibrator 150 is reset thereby allowing the gate generator 28 to close the electronic switch 52 and again allow the output from the delay network 12 to feed directly through the channel without processing.

The following discussion is concerned primarily with apparatus and method for detecting the undesirable signal also called the noise signal.

As discussed previously, mechanical defects, whether by gouges or by dust particles as applied to the grooves on a record medium, appear to the stylus member as being primarily vertical displacements located within the groove member. In view of the low frequency rumble phenomenon previously discussed, the windings of the individual stereo pickups were polarity coded so as to cancel out all vertical components of the detected signal and to add all horizontal components. The solution adopted with the introduction of stereo recordings did in fact eliminate the rumble problem when utilizing a stereo pickup head with a monaural recording and represents the same technique being used in the art today.

Detection of the undesired or noise signal is enhanced by inverting the phase of one of the pickups in the stereo pickup head and adding it to the output of the other head. This action will of course cause the vertical components of the signal in both channels which represent the undesired signal to therefore add while the horizontal components representing the desired signal will now be out of phase and cancel each other.

In a monaural system utilizing a stereo pickup head the output signals of each channel will be identical and hence there will be perfect correlation between both signals thereby resulting in the complete attenuation and hence cancelling of the desired signal while enhancing the undesired signal.

In a stereo recording there is a signal correlation between the outputs of the two channels and hence inverting the phase of one pickup and adding it to the output of the other pickup will generate a partial cancellation of the desired horizontal signal components. The noise components located primarily in the vertical components of both channels will still add resulting in an enhancement of the undesired signal and a significant reduction in the output of the desired signal. It will be immediately recognized that full cancellation does not take place since both channels in the stereo recording are not exactly equal but only correlated one to the other. The inventive concept of the noise detector will enhance the detectability of the objectionable signals as long as there is some signal correlation in both channels.

In view of the fact that the stereo pickup heads are offset 45° with respect to the plane of the recording, it will be appreciated that noise components will appear on a stereo recording not only in the vertical components from the signal in each head but also in the horizontal components of the signal from each head. Detected noise will therefore occur in both channels and be correlated to each other. Therefore, by simply adding the output of each channel to the other, there will be times when detected noise signals in each channel will appear as part of the horizontal components of the output signal. In addition, inverting the phase of one of the pickups and adding the phase of one pickup with the out of phase component of the other pickup will therefore generate noise signals in the vertical components of the output signal. In view of the fact that the noise signals are correlated to each other, it would be apparent that the noise signals from adding the outputs of the two detectors together and the noise signals from adding the inverted phase of one pickup with the output of the other pickup will generate noise correlated output signals. Actual experience has shown that the enhanced noise spikes or signals in both channels are closely related to each other depending of course on how the noise or undesired signals are detected by the stereo pickup channels.

For example, the external damage to the record may consist of a groove or gouge that varies at some changing angle to the tracking stylus. The result therefore will be that the detected noise signal will vary between the horizontal component and the vertical component and in varying degrees of amplitude depending on the relationship of the gouge at that point with respect to the tracking stylus. It has been discovered that the noise signals may vary from an in phase condition to an out of phase condition with respect to each other. This can be accommodated in the detection circuitry by full wave rectification.

Referring now to FIG. 17 there is shown a block diagram of a basic detection scheme for obtaining a portion of the left signal from the left channel source 10 and a portion of the right signal from the right channel source 16. These source signals will preferably be generated directly from the left and right pickup head, respectively, after suitable preamplification. The left signal and the right signal are both fed to an adder, the output of which represents the addition of the left and right signal which is fed to a multiplier 172.

The phase of either the left signal or the right signal is inverted and added to the output of the other pickup in order to generate a difference signal. There is no preference as far as the inventive concept is concerned as to which channel is inverted and FIG. 17 simply illustrates the situation where the right signal is fed to a phase inverter 174 that feeds an adder 176. The adder 176 also receives an input representing the left signal and generates a left minus right output signal that is fed to the multiplier 172.

As demonstrated above, the output of adder circuit 176 and adder circuit 170 will always represent a noise signal from either the horizontal component or the vertical component depending on the defect in the record being detected by the tracking stylus. The desired signal which is also fed to and through adder circuits 176 and 170 will also appear in the output of the left minus right signal and the left plus right signal being fed to the multiplier 172. The desired signal will vary between the horizontal components and the vertical components depending upon the separation and correlation of the signals at any given time and will at some times be in phase opposition with respect to each other and at times in phase, the end result is that the desired signals are attenuated and for a monaural system actually eliminated whereas substantially at all times there is always a noise signal either from the left minus right or from the left plus right channel being fed to the cross multiplier 172.

Multiplication of the two signals in the multiplier 172 will therefore further enhance the noise signals and further attenuate the desired signals in the output which is fed to a full wave rectifier 178. The multiplier 172 takes advantage of the fact that the input signals are predominantly noise signals which are enhanced as opposed to desired signals which are reduced in amplitude and which may or may not exist in the input. The multiplier has the effect of attenuating the desired signals and enhancing the noise pulses. The reason for attenuating the desired signal is so that noise detection can be accomplished as soon as possible after the noise pulse is generated, that is to say, detection should occur as early on the noise pulse as possible.

The output of the full wave rectifier 178 is fed to a threshold generator that may either work on the peak value, the RMS value or the average value or some combination depending upon external considerations. An analog signal comparator 182 receives the output of the threshold generator 180 and also the output from the full wave rectifier 178 in order to generate a substantially clean noise signal to the impulse detector 24.

A further refinement of the combiner circuit may include a more complicated cross multiplier 172 for receiving a direct left input on line 184 and a direct right input on line 186 and thereby generating an output representing the cross multiplication of the left minus right signal, the left plus right signal, and the left cross right signal. The addition of lines 184 and 186 are included for completeness only since it is recognized that a cross multiplier 172 having this capability must of necessity be more complicated and sophisticated as opposed to the simple cross multiplier capable of only multiplying the left minus right and left plus right signals together.

Referring now to FIG. 18 there is shown a circuit diagram of a typical threshold detector of the type used in the noise detective circuit as illustrated in FIG. 17. The output of the full wave rectifier 178 is fed to a follower amplifier 190 that is non-inverting and has a gain factor for scaling purposes. The output of the follower amplifier 190 is fed to an RC filter network consisting of resistor 192 and capacitor 194 having the function of filtering out and smoothing the output from the follower amplifier 190 that is fed to the analog signal comparator 182. The output signal from the low pass filter is actually DC rectified as the threshold signal against which the output signal from the full wave rectifier 178 is compared by analog signal comparator 182. It will be appreciated that by adjusting the gain of the follower amplifier 190 that a fixed gain or a variable gain or even an adaptive gain of the follower amplifier may be obtained. The threshold circuit 180 illustrated in FIG. 18 represents a typical averaging circuit technique for determining a threshold level.

Referring now to FIG. 19 there is shown another embodiment of the channel combiner 22 that eliminates the need for a cross multiplier 172 as illustrated in FIG. 17.

As described previously, the left signal is fed through the left high pass filter 171A to adder 176 and adder 170. The right signal is also fed through a right high pass filter 171 and then to adder 170 and through a phase reversing network 174 to adder 176. The cutoff frequency for the left high pass filter 171A and the right high pass filter 171 is non-critical and can be fixed anywhere from 500 HZ to 10,000 HZ. In addition, it is immaterial to the invention whether the phase reversing network 174 reverses the phase of the right signal to the left signal.

The point of departure from the embodiment illustrated in FIG. 17 is that the output of combiner 176 representing the left minus right signal is fed to a full wave rectifier 200 which in turn feeds a peak detector 202 that generates a DC voltage proportional to the peak level of the output signal, and then decays exponentially until the next peak signal is received from the full wave rectifier 200.

The output of the peak detector 202 feeds a low pass filter 204 which has the effect of smoothing out and rounding the high peak signals fed from the peak detector 202. The output of the low pass filter 204 is fed to an analog signal comparator 206 that compares the rectified noise pulses from the full wave rectifier 200 that are suitably scaled in a scaling network 208 against the output of the low pass filter 204 in order to detect and pass noise pulses of an amplitude capable of penetrating the filtered peak detector output, thereby passing noise signals to an Or gate 210.

In a similar fashion the left plus right signals from the combiner 170 are fed to a full wave rectifier 212, a peak detector 214, a low pass filter 216, and an analog signal comparator 218 which compares the full wave rectifier signals from rectifier 212 through a scaling network 220 against the output of the low pass filter 216 for passing detected signals to the Or gate 210. The function of the Or gate is to provide a logical decision which is that should noise signals be passed from either the left minus right channel or the left plus right channel, that the Or gate 210 will pass the detected noise signals to the logic network 26 as illustrated in FIG. 1.

Referring now to FIG. 20 there is shown a series of wave forms illustrating the output of the peak detector 202 and 214 and the low pass filter 204 and 216 as illustrated in FIG. 19. For example, wave forms A and B illustrate a full wave rectified signal which would exist at the output of either full wave rectifier 200 or 212. The action of the peak detector 202 or 214 is to generate an exponentially decaying signal that is initially charged to the top or peak value of the incoming signal as shown at 232 and represent the output from the peak detector 202 and 214. The low pass filter 204 or 216 has the effect of smoothing out the initial peak value and providing a filtered peak detector output signal as shown at 234. It will be noted that the effect of the low pass filter is on the initial peak output of the peak detectors 202 or 214.

Upon review, it will be apparent that the combination of peak detector and low pass filter in both the left minus right and left plus right channels is to establish a threshold value for detecting noise pulses that appear above that threshold value. It is for this reason that the individual scaling networks 208 and 220 are inserted in order to provide some control for establishing and varying the threshold voltage. The scaling network may be set initially at some arbitrary value or it may be set after circuit experimentation or even adaptively depending on circuit requirements.

The individual scaling networks may be simple resistor divider circuits.

Referring now to FIG. 21, there is shown an improved output technique for the channel combiner 22 that eliminates the Or gate 210 of FIG. 19 which is now replaced with a logic determining network that tends to reduce false alarm situations which result when sound signals are detected as noise.

The output of the analog signal comparator 206 in a left minus right channel is fed to a high speed electronic switch. The output from the analog signal comparator 218 in the left plus right channel is also fed to the high speed electronic switch 240, the output of which is fed to the impulse detector 24 as illustrated in FIG. 21.

The control for the high speed electronic switch is obtained from an analog signal comparator 242 that receives a first signal from the low pass filter 205 in the left minus right channel feeding the analog signal comparator 206 and a second signal from the low pass filter 216 in the left plus right channel also feeding the analog signal comparator 218. The purpose of the analog signal comparator 242 is to compare the DC levels from the output of low pass filter 204 and low pass filter 216 in order to select the channel where the threshold level value is smallest as determined by the lowest DC value from each of the low pass filters. The output of the analog signal comparator 242 will therefore control the high speed switch 240 to thereby select the output from the channel having the lowest threshold value. This decision is in keeping with the recognized condition that a higher threshold level value is consistent with the signal and not with noise. In other words, should one channel have a high threshold value and the other channel have a low threshold value, the logical determination is that the signal is probably a desired signal and not a noisy signal and hence the analog signal comparator 242 will select the channel having the lowest threshold value to thereby prevent the generation of a false alarm signal.

It is quite obvious to those skilled in the art that additional and different kinds of logic networks may be used to compare the signals being detected in each of the left minus right channel and the left plus right channel to determine the probability that the detected signal is either noise or desired signal.

Referring now to FIG. 22 there is shown still another embodiment of the noise detector system in which a pair of detecting systems are used to detect more obvious and louder objectionable signals called Pops and a second detection system is used to detect the smaller and less noisy signals caused by dust particles in the record medium and usually heard during quiet passages of music and sometimes called Ticks and Clicks.

In the embodiment illustrated in FIG. 22 the left signal and right signal are directly combined to form a left plus right signal in combiner 170. The output of combiner 170 is fed to a high pass filter 250 having a cutoff frequency between 5 KHZ and 10 KHZ, the output of which is then fed to the full wave rectifier 212 which feeds the threshold circuits as more fully illustrated and described in connection with FIG. 17 or FIG. 19.

The difference between the direct left signal and right signal is obtained in combiner 176 after feeding the right signal through a phase inverter circuit 174. The output of combiner 176 represents the left minus right signal which is fed to a high pass filter 252 having a cutoff frequency of approximately 500 HZ, the output of which is fed to the full wave rectifier 200 which eventually feeds the threshold circuits as more fully described in connection with FIGS. 17 and 19.

The modifications illustrated in FIG. 22 may be duplicated with the left minus right channel having a high pass filter with a cutoff of 5 to 10 KHZ and a left plus right channel having a high pass filter with a cutoff of approximately 500 HZ. This would of course result in a noise detecting system having four outputs which can then be logically treated in any fashion as described elsewhere in the specification.

Referring now to FIG. 23, there is shown an alternative circuit for enhancing the detection of the smaller Tick and Click sounds. Figure 23 simply represents a modification of the left plus right channel ilustrated in FIG. 22. For example, the left minus right channel is generated in the same fashion as described in connection with FIG. 22 and is fed to similar circuitry for detecting the Pop signals. The modification for the left plus right channel is that the left signal is fed directly to a high pass filter 260 having a cutoff frequency of approximately 50 HZ, the output of which is fed to a full wave rectifier 262 and then fed to the combiner 170. On the other hand, the right signal is fed directly to a high pass filter 264 having a cutoff frequency of between 5 KHZ to 10 KHZ, the output of which is fed to a full wave rectifier 266 and then fed to the combiner 170 for generating the left plus right signal. It will be apparent by comparing FIGS. 22 and 23 that the modification shown by FIG. 23 is that the high pass filter and full wave rectifier for the left channel and the high pass filter and full wave rectifier for the right channel take place before the signals are combined in the combiner 170. Experience has shown that adding the signals before combining and eventual detection does in fact result in an enhancement of the detecting process. In view of the tic and click signals being smaller and of lower amplitude, combining before detection has proven advantageous whereas the pop circuits are detecting signals of greater magnitude and hence the additional sensitivity achieved in the left plus right channel is not needed for the pop detection in the left minus right channels.

Referring now to FIG. 24, there is shown an alternate noise detecting system. The system of FIG. 24 is placed in the left minus right channel for illustration but may be also placed in the left plus right channel.

The right channel is fed to a phase inverter 174 which feeds a combiner 176 and also receives the left channel directly for generating a left minus right signal. As mentioned previously, there is no apparent difference as to whether the left or right channel is phase inverted as long as the output signal from combiner 176 represents the difference between the two input signals. The output from the combiner 176 is fed to a high pass filter 270 having a cutoff frequency between 500 HZ and 10,000 HZ.

One output of the high pass filter 270 feeds a peak detector 272 that responds to the peak positive voltage on each cycle of the signal passing from the high pass filter 270. The output of the peak detector 272 is fed to an analog signal comparator 274.

Another output of the high pass filter 270 is fed through a phase inverter 276 to another peak detector 278 which measures the peak amplitude of the negative half cycle output from the high pass filter 270 as a positive voltage which is fed to an analog signal comparator 280. It will be appreciated therefore that peak detector 278 will be measuring the peak amplitude of the same signal measured by the peak detector 272 but effectively displaced one-half cycle away.

An additional output from the high pass filter 270 is fed to an attenuator 282 that is actually a resistive scaling network that feeds the analog signal comparator 280 directly and also feeds the analog signal comparator 274 through a phase inverter 284.

A review of the analog signal comparator 274 will show that a comparison is made between the positive going signals from the high pass filter detected by the peak detector 272 against an attenuated inverted signal that is therefore one-half cycle displaced from the output measured by the peak detector 272. The output of the analog signal comparator 274 is therefore a threshold circuit that continually compares the positive peak detected signal against the next one-half negative cycle that has been inverted in phase. In other words, the analog signal comparator 274 actually compares the positive peak detected signal against a scaled version of the next one-half cycle passing through the high pass filter 270.

In a similar fashion the analog signal comparator 280 compares the negative half cycle peak detected signal that has been inverted by phase detector 276 against the next attenuated positive signal emanating from the high pass filter 270.

A statistical analysis of noisy signals has shown that a noisy signal will generate a substantially higher voltage signal output than the desired signal at any given time. Experience has shown that a difference in desired signal and noisy signal of at least 10 to 1 will, on a statistical basis, indicate the presence of noise. Experience has shown that desired signals measured one-half cycle apart tend to increase in amplitude from cycle to cycle at a substantially lower rate.

The attenuator 282 is therefore preset to determine the arbitrarily selected ratio which for this example is set at 10 to 1, thereby causing either analog signal comparator 280 or 274 to generate an output signal whenever the two input signals differ by an amplitude ratio of 10 to 1 or more. The output of the analog signal comparator 280 and the analog signal comparator 274 is fed to an Or gate 286 which indicates logically that should a signal be received from either analog signal comparator 280 or analog signal comparator 270 that the Or gate 286 will pass the detected signal as a detected noise signal.

Referring now to FIG. 25 there is shown a variation of the noise detector system shown in FIG. 24 but now applied to the left plus right signal for detecting pops. The left and right channels are both fed directly to a combiner 170 which generates the left plus right signal which is fed to a high pass filter 288 that has a cutoff frequency between 5 KHZ and 10 KHZ. The output of the high pass filter 288 is then fed to the same kind of dual peak detector circuits as illustrated in connection with FIG. 24.

In this fashion the complete noise detecting system would include a left minus right channel for detecting tics and clicks and a left plus right channel for detecting pops.

Depending on the severity of the undesired noise signal present on the record medium, it may be necessary to incorporate both a tic and click channel and a pop channel or it may only be necessary to utilize one channel for detecting all undesired noise signals. The actual determination will be made by the condition of the record medium being played.

The system described in connection with FIGS. 23 and 24 is based primarily on the setting of the attenuator which is preset based upon experience of the ratio of the signal strength between consecutive half cycle portions. In the usual sense a noise signal invariably and without warning suddenly appears as a large voltage spike which, when compared with the signal one-half cycle before or afterwards, would probably represent a ratio well over 10 to 1 and in many cases approaches ratios of 25 to 1. The actual ratio will probably depend upon the kind of music that is being played. For example, the attenuator could be set at a higher ratio setting when playing soft lullaby music since the ratio between the threshold music level and the noise signal would probably be extreme, whereas the same attenuator would in all probability be set at a lower ratio level when playing more modern music of the type sometimes called electronic music since the sound levels do change quite rapidly and without substantial warning.

The actual setting of the attenuator and the ratio required to eliminate most of the undesired signal is therefore based upon the noise pulses having a cycle to cycle ratio that is greater than that expected for the desired signal on the record medium.

I claim:

1. A system for detecting undesired signals on a record medium having desired recorded signal information comprising:
   means for generating a pair of correlated signals termed signal A and signal B from said desired recorded signal information on said record medium,
   means for combining said pair of correlated signals A and B to attenuate said desired recorded signal information and enhance undesired signals,
   means for generating a gating signal having a leading edge determined by said undesired signals and a trailing edge directly determined by said desired recorded signal information, and
   means for generating at least one delayed output signal from said desired recorded signal information,
   gating means for gating out undesired signals from said delayed output signal with said gating signal, and
   means for substituting information that is consistent with said desired recorded information during said gating signal.

2. A system according to claim 1 in which said substitution signal is an exponentially decaying signal,
   said decaying signal having an initial value equal to the desired recorded information signal at the instant said gating means gates out said undesired signal,
   said decaying signal continuing until said desired recorded information signal equals the value of said decaying signal thereby generating said trailing edge for said gating signal.

3. A system according to claim 1 in which said pair of correlated signals are generated by using a stereo pickup head having correlated output signals A and B in two separate channels.

4. A system according to claim 3 in which said stereo pickup head generates a pair of identical correlated signals A and B.

5. A system according to claim 1 in which said means for combining comprises means for generating the sum (A+B) of signals A and B and means for generating the difference (A−B) of signals A and B and means for generating the product of the difference (A−B) and the sum (A+B) of signals A and B.

6. A system according to claim 1 which includes means for rectifying the output of said combining means, and at least one threshold means connected to the output of said rectifying means for establishing a threshold level of said desired recorded signal information relative to said undesired signals.

7. A system according to claim 6 which includes a first and a second threshold means and in which said first threshold means includes a high pass filter having a cutoff frequency of approximately 500 Hertz and said second threshold means includes a high pass filter having a cutoff frequency of approximately 5 KHZ to 10 kilohertz.

8. A system according to claim 7 which includes logic means connected to said first threshold means and said second threshold means for selecting said threshold means having the smallest threshold level.

9. A system according to claim 1 in which said means for combining comprises a first generating means for generating the sum (A+B) of signals A and B and a second generating means for generating the difference (A−B) of signals A and B.

10. A system according to claim 9 which includes a first threshold means for establishing a threshold level of said desired recorded signal information relative to said undesired signals connected to the output of said first generating means, and a second threshold means for establishing the threshold of said desired recorded signal information relative to said undesired signals connected to the output of said second generating means.

11. A system according to claim 10 in which said second threshold means includes a high pass filter having a cutoff frequency of approximately 500 hertz and said first threshold means includes a high pass filter having a cutoff frequency of approximately 5 KHZ to 10 kilohertz.

12. A system according to claim 10 which includes logic means for selecting the output of either said first threshold means or said second threshold means.

13. A system according to claim 1 wherein said gate signal has a width greater than the width of said undesired signals.

14. The method of detecting undesired signals originating from a record medium that are generated by mechanical defects on the record medium comprising the steps of:
   first generating a pair of correlated signals from the recording medium,
   then combining the outputs of the correlated signals so that desired signals are attenuated and undesired signals are enhanced,
   then generating a gating signal having a leading edge determined by said undesired signals,
   then using the leading edge to begin replacing said undesired signals with a replacement signal that is consistent with said desired signals, and
   then generating a gating signal trailing edge determined by said replacement signal and said desired signals.

15. The method of detecting undesired signals originating from a record medium that are generated by mechanical defects on the record medium comprising the steps of:
   first generating a pair of correlated signals from the recording medium by using a stereo pickup head,
   then combining the output of the stereo pickup head so that desired signals are subtracted and undesired signals are added,
   then generating a gating signal having a leading edge determined by said undesired signals,
   then using the leading edge to begin replacing said undesired signals with a replacement signal that is consistent with said desired signals, and
   then generating a gating signal trailing edge determined by said replacement signal and said desired signals.

* * * * *